United States Patent
Morehead

(10) Patent No.: US 7,817,423 B2
(45) Date of Patent: Oct. 19, 2010

(54) PELTIER-ASSISTED LIQUID-COOLED COMPUTER ENCLOSURE

(76) Inventor: Graham Andrew Morehead, 112A High St., Waltham, MA (US) 02453

( * ) Notice: Subject to any disclaimer, the term of this patent is extended or adjusted under 35 U.S.C. 154(b) by 710 days.

(21) Appl. No.: 11/712,142

(22) Filed: Feb. 28, 2007

(65) Prior Publication Data

US 2009/0284911 A1 Nov. 19, 2009

Related U.S. Application Data

(60) Provisional application No. 60/779,129, filed on Mar. 6, 2006.

(51) Int. Cl.
*H05K 7/20* (2006.01)

(52) U.S. Cl. .................. 361/700; 361/695; 361/699; 361/721; 174/15.1; 174/16.3; 165/80.4; 165/104.33

(58) Field of Classification Search ............... None
See application file for complete search history.

(56) References Cited

U.S. PATENT DOCUMENTS

| | | | | |
|---|---|---|---|---|
| 5,473,508 A * | 12/1995 | Porter et al. | ................. | 361/695 |
| 6,628,520 B2 * | 9/2003 | Patel et al. | .................. | 361/696 |
| 6,789,611 B1 * | 9/2004 | Li | .......................... | 165/104.29 |
| 6,927,980 B2 * | 8/2005 | Fukuda et al. | .............. | 361/700 |
| 6,970,355 B2 * | 11/2005 | Ellsworth et al. | ........... | 361/694 |
| 7,342,789 B2 * | 3/2008 | Hall et al. | .................... | 361/701 |
| 7,349,213 B2 * | 3/2008 | Campbell et al. | ........... | 361/699 |
| 7,466,549 B2 * | 12/2008 | Dorrich et al. | .............. | 361/699 |
| 7,551,440 B2 * | 6/2009 | Belady et al. | ............... | 361/699 |
| 7,552,758 B2 * | 6/2009 | Garner et al. | .............. | 165/80.4 |
| 2005/0047085 A1 * | 3/2005 | Mankaruse et al. | ......... | 361/695 |

* cited by examiner

*Primary Examiner*—Boris L Chervinsky

(57) ABSTRACT

Disclosed is a design for a computer enclosure. Heat is passed from the heat-generating components directly to a non-conductive liquid coolant. Some of the heat is expelled directly to the environment via a heatsink "chimney", and some is expelled with the help of a thermoelectric heat pump.

3 Claims, 22 Drawing Sheets

Figure 1:
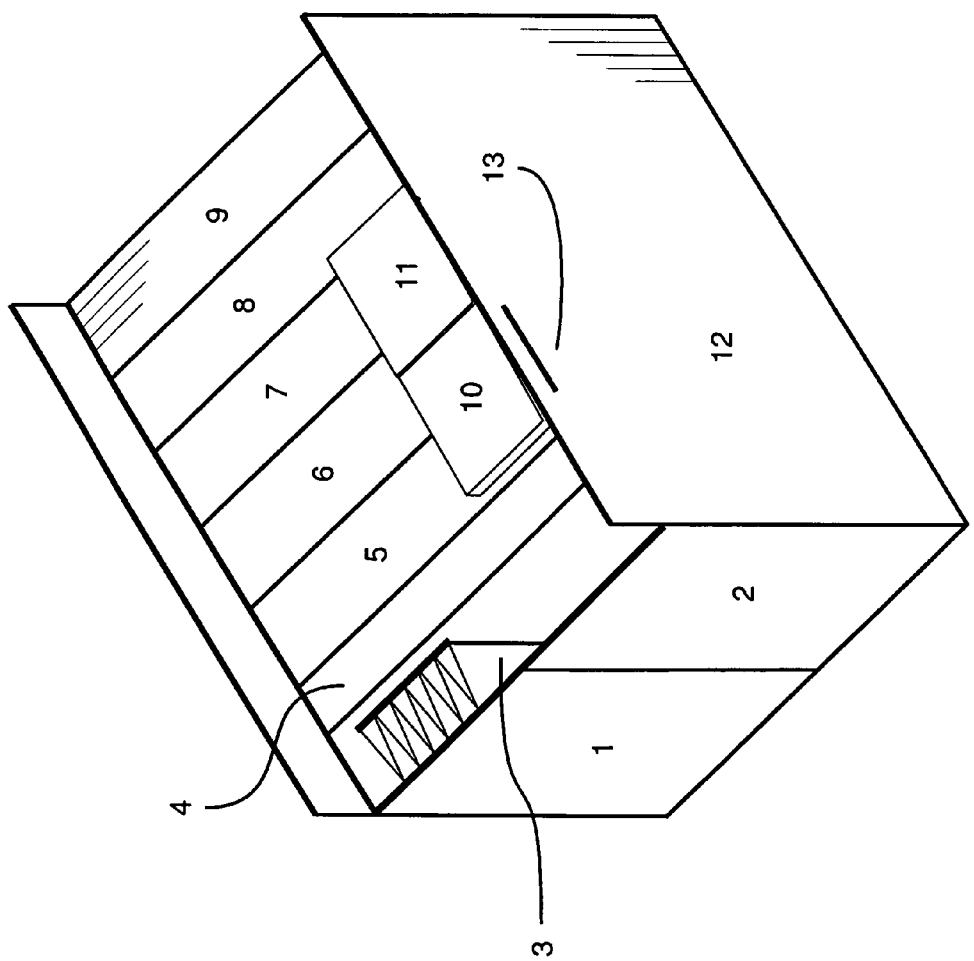

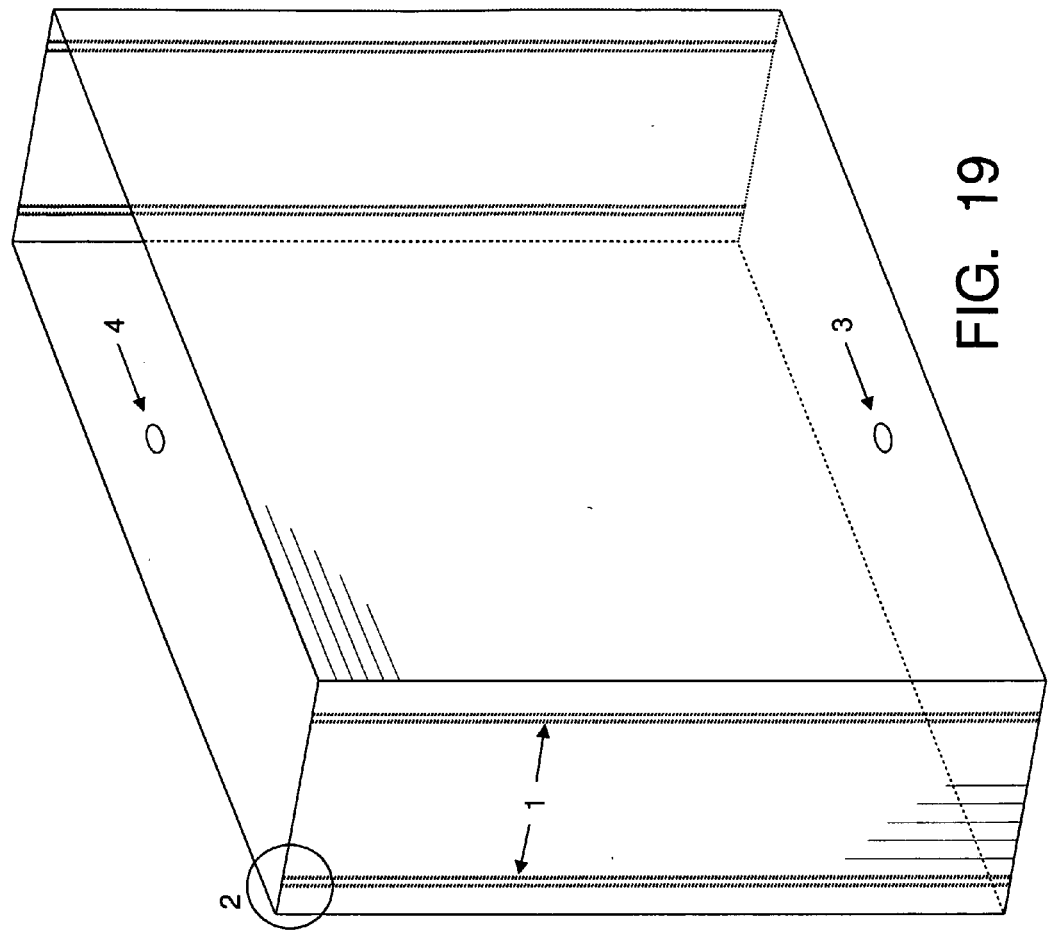
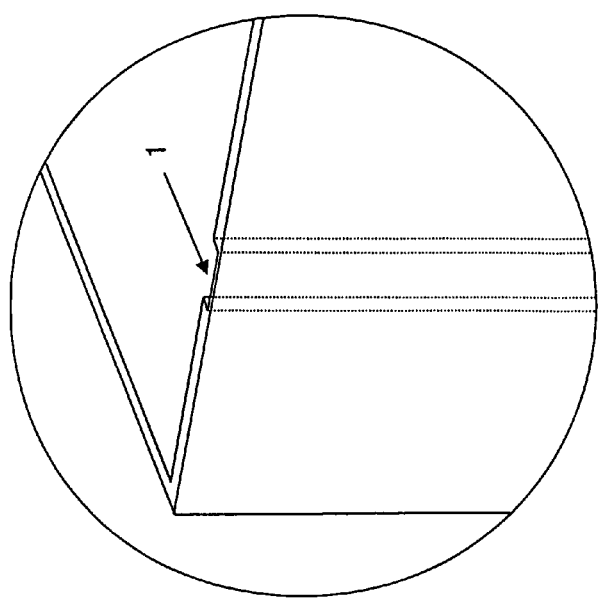
FIG. 19
FIG. 18

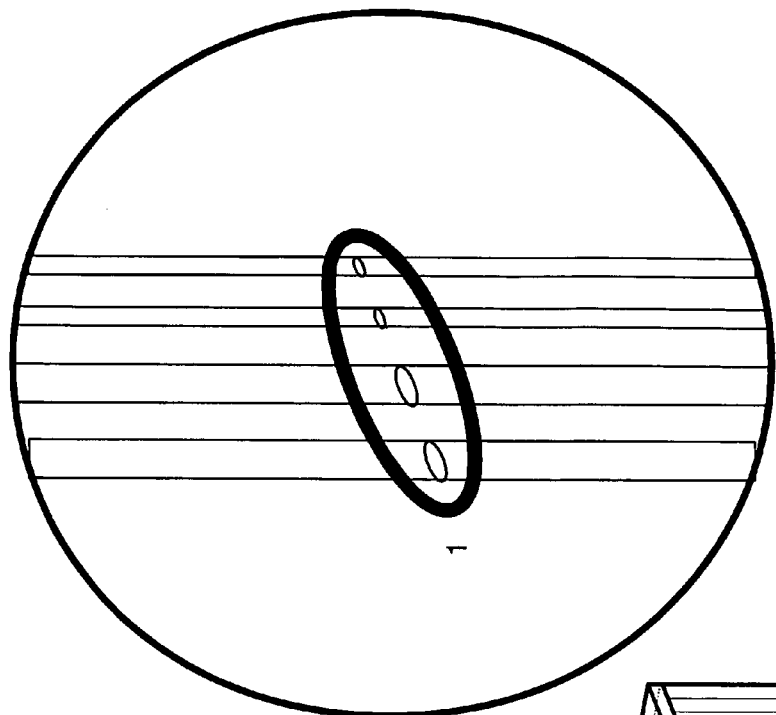
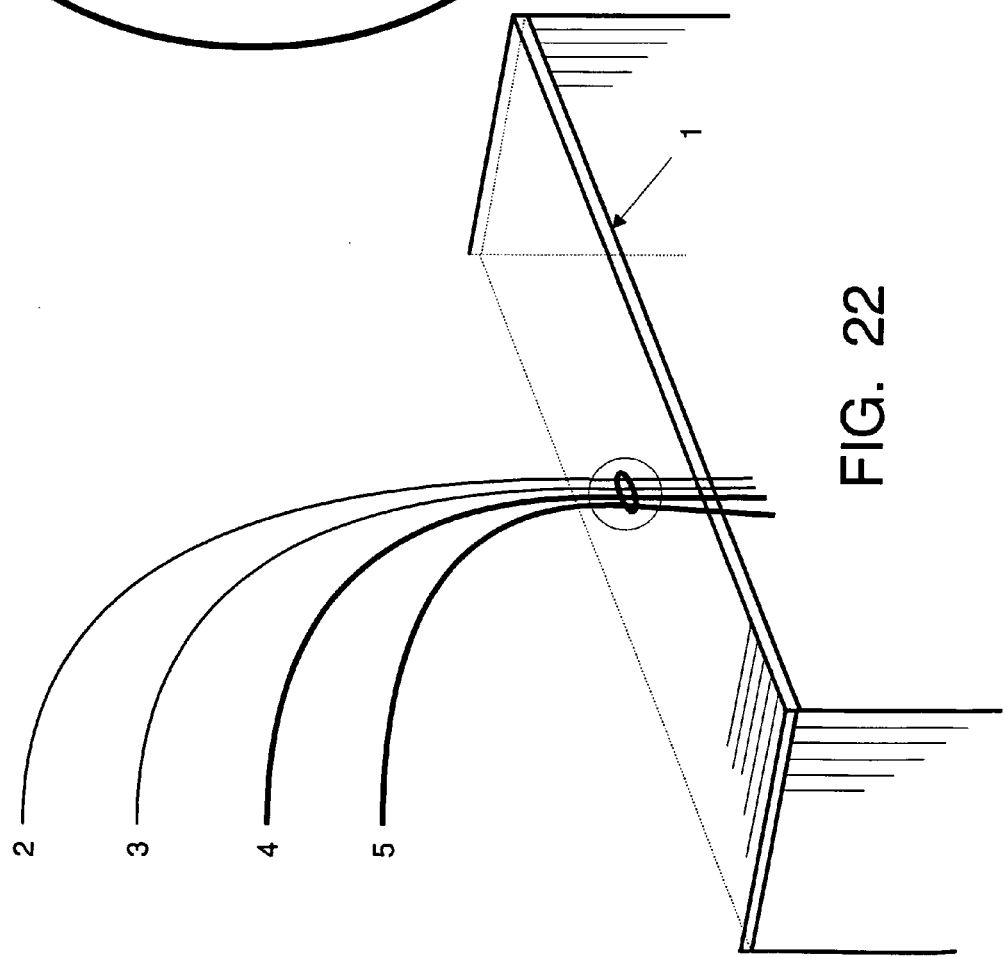
FIG. 23
FIG. 22

PELTIER-ASSISTED LIQUID-COOLED COMPUTER ENCLOSURE

PARENT CASE TEXT

This patent application claims the benefit of priority under the U.S. Provisional Patent Application No. 60/779,129, titled "Compact multiprocessor Peltier-assisted liquid-cooled standard-component computer", filed at a U.S. Post Office on Mar. 1, 2006, and received at the USPTO on Mar. 6, 2006.

FIELD OF THE INVENTION

The field of the invention includes electronics, cooling systems, and supercomputing. The invention is a machine: a small-footprint supercomputer which maximizes the capabilities of standard hardware.

BACKGROUND OF THE INVENTION

Supercomputing is a field that attempts to take the best of presently available technology and with it build a device that will enable the processing of logic on a scale not previously available. The most well-known names connected to supercomputing include ENIAC, Cray, Thinking Machines, IBM Deep Blue, and the Earth Simulator built by NEC in Yokohama. Each of these represent a step forward in top-end supercomputing.

Like other supercomputers, the present invention is useful for solving mathematical problems that would be too cumbersome for less-powerful computers. These problems may come from science, economics, pure math, or a multitude of other sources. The ENIAC was used to calculate trajectories. The Earth Simulator will hopefully be able to predict hurricanes. The present invention is a multipurpose computer—it would be very useful, for example, in enacting calculations of protein folding, market modeling, artificial intelligence, fluid dynamics, and any other parallelizable mathematical problem.

Most researchers in this field work using the principle of parallel processing: multiple processors each working on a separate part of a problem. The present invention also works on this principle. It is different from prior art because of the design of the enclosure. Its design enables the supercomputer to be uniquely compact, quiet, and fast.

All high-end semiconductor-based computers have one or more major heat-generating components. Conventional computers are air cooled using finned heatsinks and fans. Many high-end computers are liquid cooled—typically by a circulation of water which comes in thermal contact with the main heat-generating components, without actually coming in contact with them. Because of water's conductive and corrosive qualities, it must be kept totally contained and must never touch any electronic components directly. The most extreme water cooling of computers usually includes a separate block each for cooling the CPU, the RAM, the on-board chipset, and sometimes the video card. While not the hottest spots on the board, the other components still create some heat, which is usually dissipated through convection to circulating air, whether by natural ventilation or by a fan.

Some supercomputers, like the Cray-2, were cooled by the forced convection of a non-conductive liquid that was in direct contact with the electronic components. In the case of the Cray-2, a fluorocarbon known as FC-77, or perfluoro-octane, was used. It was passed through a heat exchanger where it was cooled by a continuous source of chilled water. Like in the Cray-2, the present invention transfers its heat to a liquid coolant which comes in direct contact with the heat-generating components. The invention can use FC-77, or another substance called perfluoro-hexane, or any other liquid that is non-conductive and non-corrosive. The ideal liquid coolant would have a high thermal transmittivity, be chemically stable below 150C, and neither react with nor dissolve plastics, metals, nor adhesives.

Unlike the Cray, the present invention does not require a constant supply of chilled water. Heat is both convexed and radiated to the environment by methods described below. The expression of heat to the environment is augmented with the help of solid-state thermoelectric coolers.

The present invention relies on the Peltier effect to boost the efficiency of its heat transference system. The Peltier effect was discovered by Jean Charles Athanase Peltier in 1834. He described how a temperature differential can be created by an electric current flowing through certain combination of materials. These combinations became known as thermoelectric coolers, or heat pumps. The amount of heat that is moved through a Peltier-effect device is proportional to the current. It is the inverse of the phenomenon discovered by Thomas Johann Seebeck in 1821. The usage of Peltier-effect devices to cool electronic components wasn't prevalent until the 1950's once a better understanding of these materials was available. The present invention is different from prior art because of its combination of the usage of a thermoelectric cooler with direct liquid convection cooling of computer components and the vertical cooling passages, which will be called "heatsink chimneys" from here on. More specifically, each heatsink chimney has two parts: the "coolant chimney" and the "air chimney". These will be described later. This invention enables two very desirable qualities: quiet and speed. The invention is quieter than air-cooled computers because of their heavy reliance on fans. The invention can use fans in certain embodiments, but it does not require as much assistance from fans. The invention is faster than air-cooled supercomputers because liquid-cooling opens up the possibility of overclocking (a procedure where the CPU is reprogrammed to run faster than the factory defaults). Overclocking in an air-cooled computer usually results in a burnt-out CPU.

DEFINITIONS 64-bit processor: A processor that takes input chunks of 64 bits each.

air chimney: A chamber with extruded fins on the inside designed to allow air to pass from the bottom and out the top. The main body is constructed from a material with high thermal conductivity. The external surface is constructed from a material with maximized thermal emissivity.

black-anodized aluminum: Aluminum that has undergone a electrolytic process to oxidize its surface for the purpose of increasing thermal emissivity.

bus interlink connection: a high-speed connection between the buses of two motherboards, typically through their PCI slots.

bit: One binary atom of computer information storage—a 1 or a 0.

block-memory device: Computer memory storage device divided into bytes.

B (byte): A unit of computer memory made of eight bits, also called an octet.

chipset: a set of on-board processors that manage various control features such as controlling the cache, direct memory access, handling interrupts, transferring data over the I/O bus, etc.

cluster: a plurality of interconnected processors that can be employed to compute different piece of the same overall computation coolant chimney: A chamber with extruded fins on the inside designed to allow liquid cooling to pass from the top and out the bottom.

coolant conduit: a tube that carries the liquid coolant.

CPU (Central Processing Unit): the main information processing component of a standard computer, typically residing on a silicon chip.

dual-core chip: a single chip with two CPU's.

file system: the structures that are used to organize data at a high level on a hard drive.

firewall: a software process or hardware component that acts as a door between an external network and an internal computer or network—a door which only allows approved communication.

GB (Gigabyte): A typical measurement of block-memory for computers approximately equal to 1×10$^9$ bytes; exactly equal to 1024 MB.

GHz (Gigahertz): A typical measurement of processor speed. A 64-bit core will process one 64-bit instruction in each cycle. Hertz is a measurement of the cycles per second.

head node: A combination of hardware and a software process that sits at the top of a hierarchy of processes. It is enabled to transfer tasks to other processors.

heat radiation: All objects with a temperature above absolute zero emit light in the infra-red part of the spectrum. In the context of heat emission, this light is referred to as radiation.

heatsink: A surface with extruded fins composed of a material with advantageous thermal conductivity which is typically used to transfer heat from a hot zone to the environment.

heatsink chimney: A "coolant chimney" coupled with an "air chimney"

hot swap: To replace a computer component without rebooting or powering down.

KB (Kilo-byte): A typical measurement of block-memory for computers approximately equal to 1×10$^3$ bytes; exactly equal to 1024 B.

logical relationship: The relationship which describes how two or more processors transfer information.

main motherboard: The motherboard on which the head node operates.

MB (Mega-byte): a typical measurement of block-memory for computers approximately equal to 1×10$^6$ bytes; exactly equal to 1024 KB.

motherboard: An electronic board that logically supports all computer components, and electrically supports the CPU, RAM, chipset, and other components.

network cable: The cable that carries standard communication between computers.

network switch: A device that takes messages from multiple computers and delivers these messages to their proper recipient computers while maintaining a symmetrical realized bandwidth for each computer's communication capability.

node: A logical process that handles commands. If a head node, it can manage the distribution of commands to other nodes. It is a concept that exists in software and runs on one processor at a time.

operating system: The basic software processes upon which higher level programs run. Typical examples include Linux, AIX, and Solaris optical drive: A block-memory device that encodes/decodes information using a laser on a substrate. Typical examples are DVD and CD.

overclock: To force a CPU to process instructions at a faster rate (Hz) that its advertised capability.

parallel processing: To run more than one software process simultaneously.

Peltier effect: Discovered by Jean Charles Athanase Peltier in 1834, it described how a temperature differential can be created by a current flowing through certain materials.

PSU (Power Supply Unit): the transformer that takes AC voltage as input and supplies several different DC voltages as output—the voltages that are required for the components of a computer.

RAM (Random Access Memory): high speed on-board block-memory device.

slave motherboard: A motherboard running only slave nodes.

slave node: A node which accepts commands from another node.

stack: An orderly pile of instructions.

TB (Tera-byte): another measurement of block-memory for computers approximately equal to 1×10$^{12}$ bytes; exactly equal to 1024 GB.

TCP/IP (Transmission Control Protocol/Internet Protocol): The most commonly used standard for communication between two computers over a network.

thermal conductivity: The propensity of a substance for carrying heat.

thermal contact: Able to pass heat effectively by convection alone, i.e. without radiating.

thermal emissivity: The propensity of a substance for radiating heat.

thermoelectric cooler: A solid-state heat pump which exploits the Peltier effect uninterruptible power supply: A component that acts as a transformer converting standard AC to one more DC voltages which are used to charge one or more corresponding batteries. Charge is drawn from the batteries to provide power. Sometimes the battery power is first converted back into standard AC.

VFS (virtual file system): A file system that is accessible over the network. A remote node can be configured so that its processes interact with the VFS as if it were a local file system.

BRIEF DESCRIPTION OF THE DIAGRAMS

All of the diagrams correspond to preferred embodiments of the invention. Blocks are idealized in these diagrams. In reality, some of the components will not be perfectly rectangular in shape. These diagrams are meant to show the configuration or relative placement of each component within the invention. This level of specificity is sufficient for a skilled person to construct the invention.

FIG. 1: ANGLE VIEW

This figure shows the preferred embodiment of the invention from an angle. The internal components are out of view because of opaque case panels. Another optional cover can be placed on top. It is not shown here so that at least these components can be seen. The labeled items are as follows:
 1,2: AIR CHIMNEYS (External chambers with extruded fins on the inside and air flowing from below).
 3: HEATSINK FINS (For cooling the air flowing up through the Air Chimney)
 4: COOLANT CHIMNEYS (Internal chambers with extruded fins on the inside and liquid coolant flowing from above).
 5: PSU (Power Supply Unit—A transformer which converts AC voltage to the various DC voltages required by each component)
 6: CHAMBER 1 (Each chamber is a liquid-tight enclosure containing two motherboards)
 7: CHAMBER 2
 8: CHAMBER 3
 9: CHAMBER 4
 10: Optical Drive (This component is removed from view in most other figures because it obscures the view of other components)
 11: Hard Drive (This component is removed from view in most other figures for the same reason)
 12: Front panel
 13: Slot for Optical Drive FIG. A shows the main components and the orientation of the invention. The views in the following figures correspond to this orientation. The extruded fins inside Air Chimney 1 are visible from this view because they are in run along the top half of this chimney. The fins for Air Chimney 2 run along its bottom half.

Figure 2:
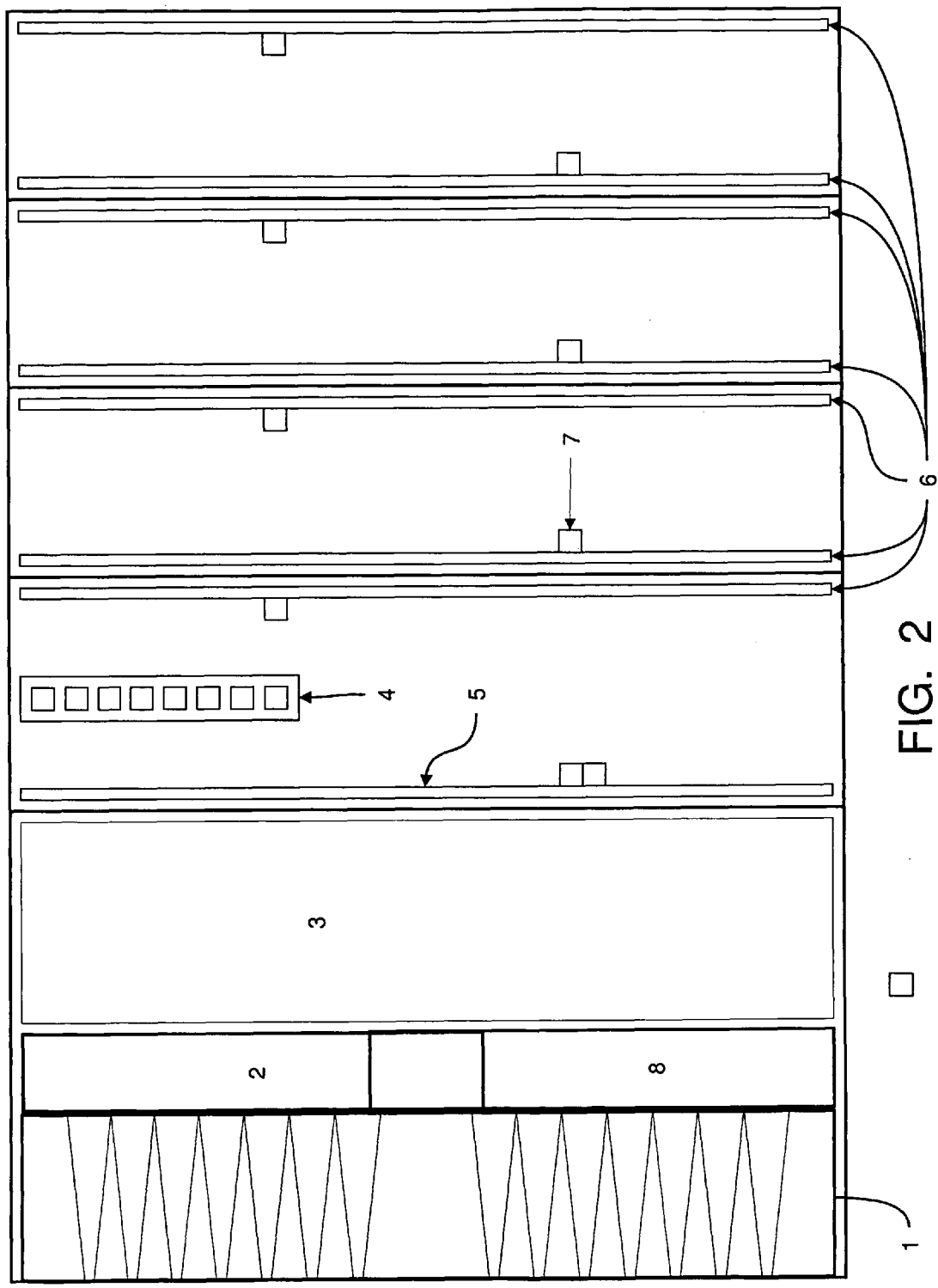

FIG. 2: TOP VIEW without connectors

This figure shows the invention from the top. There are no connectors or opaque case panels in this figure to obscure the view of the internal components. The labeled items are as follows:
 1: Air Chimneys
 2: First Coolant Chimney
 3: Power supply
 4: High-speed network switch
 5: Main motherboard
 6: Slave motherboards
 7: A Network interface (There are many in this figure)
 8: Second Coolant Chimney Starting at the left, the individual heatsink fins inside both chimneys can seen head-on since they run vertically. Under each of them is a fan, which is not visible in this figure. To the right is the PSU. After that are four chambers, each with two motherboards. Each motherboard has at least one network connection, which is denoted by a small square (8). The main chamber also contains the high-speed switch, which has at least 8 ports.

Figure 3:
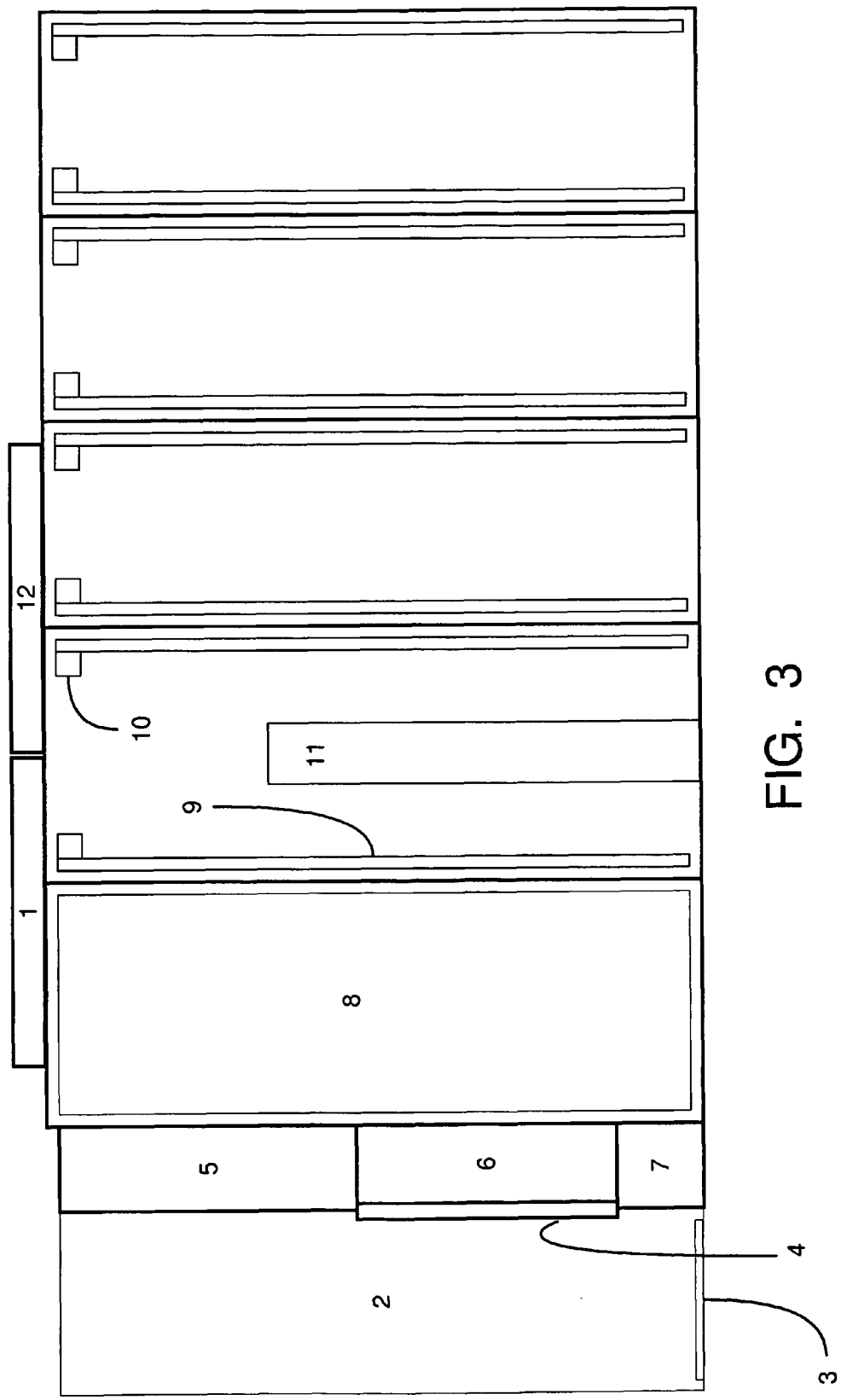
Figure 4:
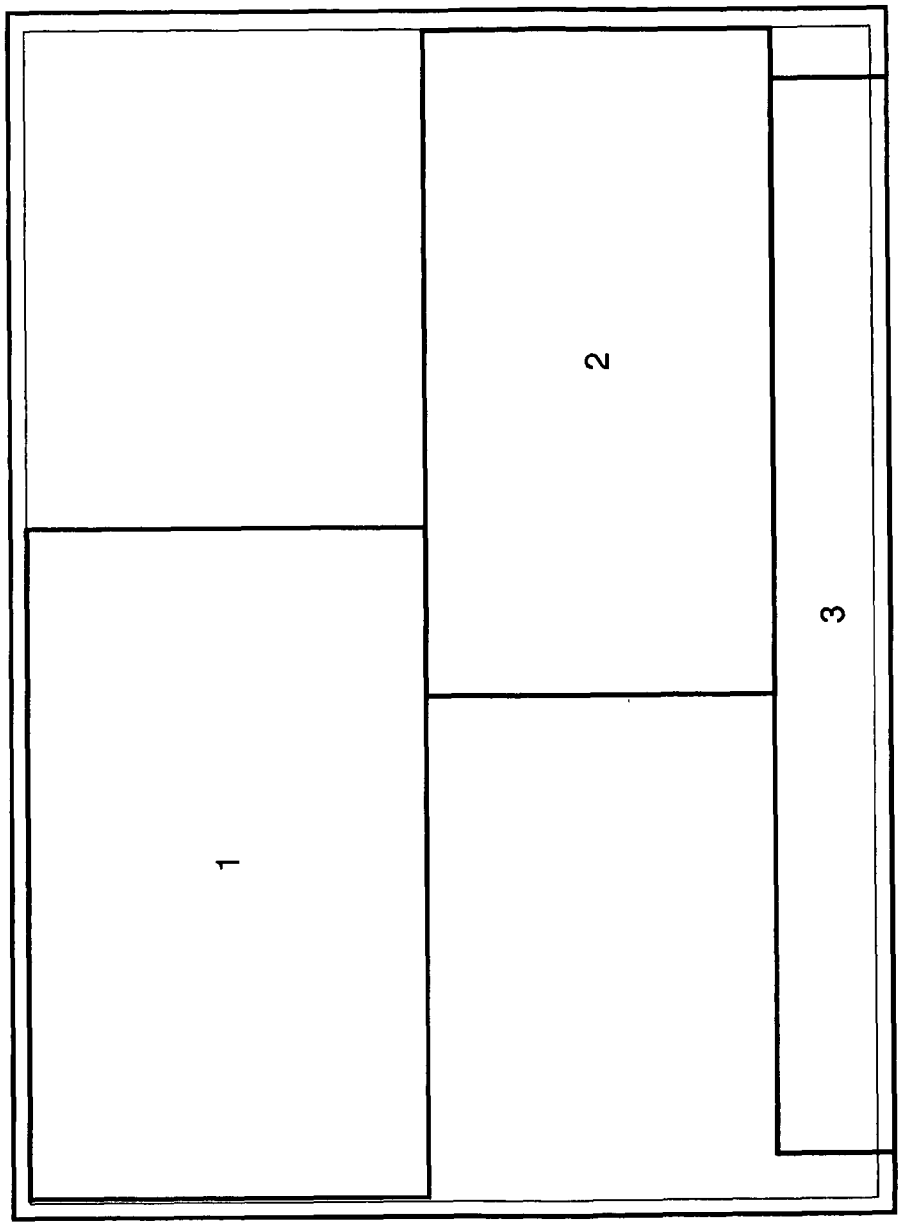

FIG. 3: FRONT VIEW without connectors

This figure shows the invention from the front. There are no connectors or opaque case panels in this figure to obscure the view of the internal components. The labeled items are as follows:
 1: Optical Drive
 2: Air Chimneys
 3: Fans
 4: Layer of thermoelectric coolers
 5: First Coolant Chimney
 6: Second Coolant Chimney
 7: Pump
 8: Power supply
 9: Main motherboard
 10: Network interface example (there are 8 in this figure)
 11: High-speed network switch
 12: Hard drive This figure shows most of the same components as FIG. B. Heated liquid arrives in the first coolant chimney (5). Much of its heat is transferred to the first air chimney which is thermally connected to this chamber. The semi-cooled liquid then flows into the second coolant chimney (6) which is thermally connected to a layer of Peltier-effect coolers, which are in turn thermally connected to the second air chimney. This second chamber acts as a reservoir. The pump (7), which is underneath, draws the now cooled liquid from this chamber and sends it to the motherboard chambers which contain the heat-generating components. The only heat-generating components which are not in a liquid cooled chamber are the Optical Drive and the Hard Drive. Because of their position on top, their heat is easily dissipated into the environment.

FIG. 4: LEFT VIEW WITHOUT AIR CHIMNEYS

This figure shows the invention from the left with the air chimneys removed to reveal the coolant chimneys. The labeled items are as follows:
 1: Coolant Chimney 1
 2: Coolant Chimney 2
 3: Pump After it has been heated, coolant passes (in both liquid and gas form) into the first coolant chimney (1), where it condenses and cools, and then passes into the second coolant chimney (2), where it is further cooled before being sucked out by the pump (3).

Figure 5:
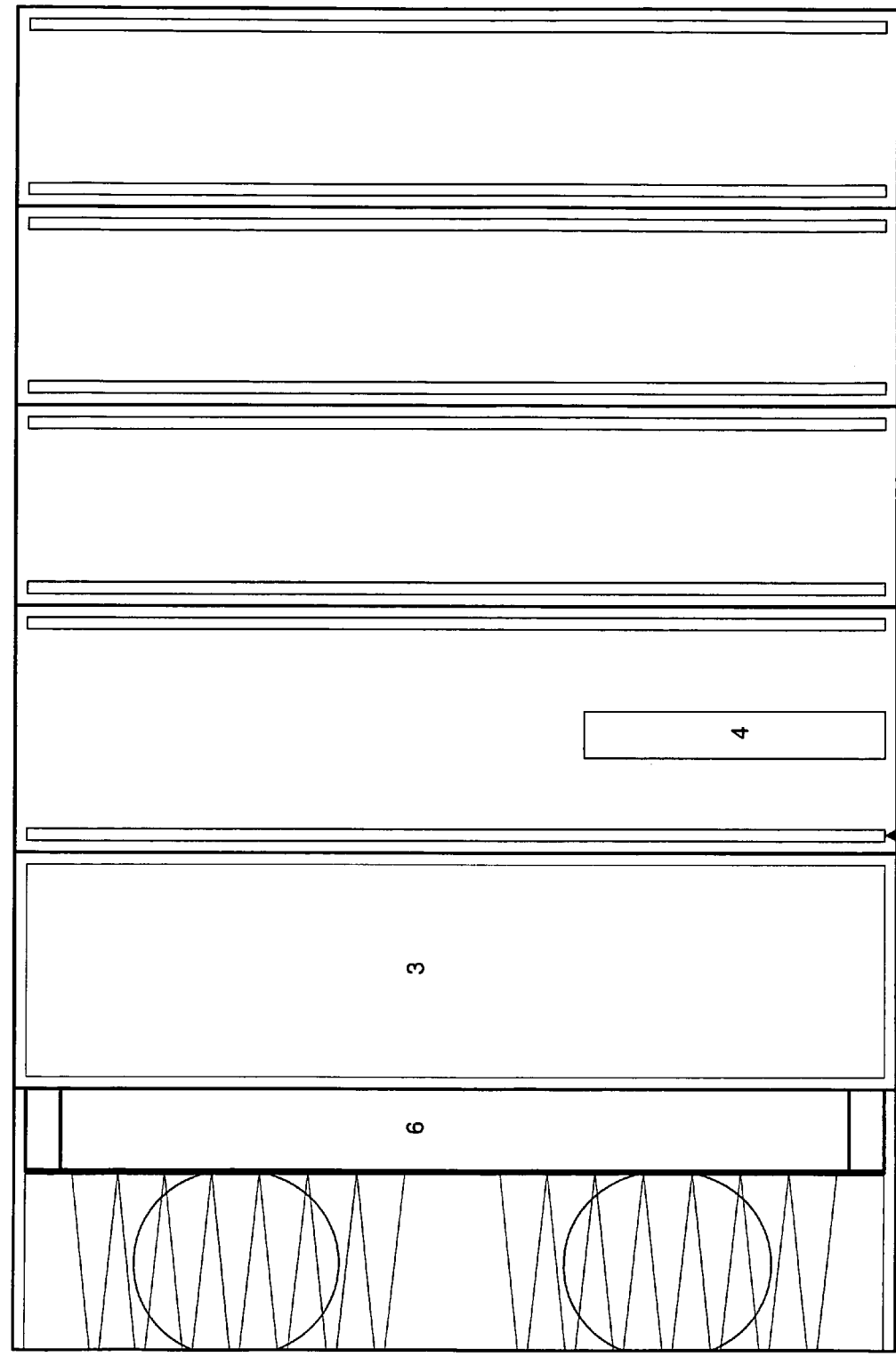

FIG. 5: BOTTOM VIEW without connectors

This figure shows the invention from the bottom. There are no connectors or opaque case panels in this figure to obscure the view of the internal components. The labeled items are as follows:
 1: Air Chimney 1
 2: Air Chimney 2
 3: Power supply
 4: Network switch
 5: Main motherboard
 6: Pump This figure shows many of the components from FIG. B, but in this view from the bottom both cooling chambers are obscured and the pump is visible.

Figure 6:
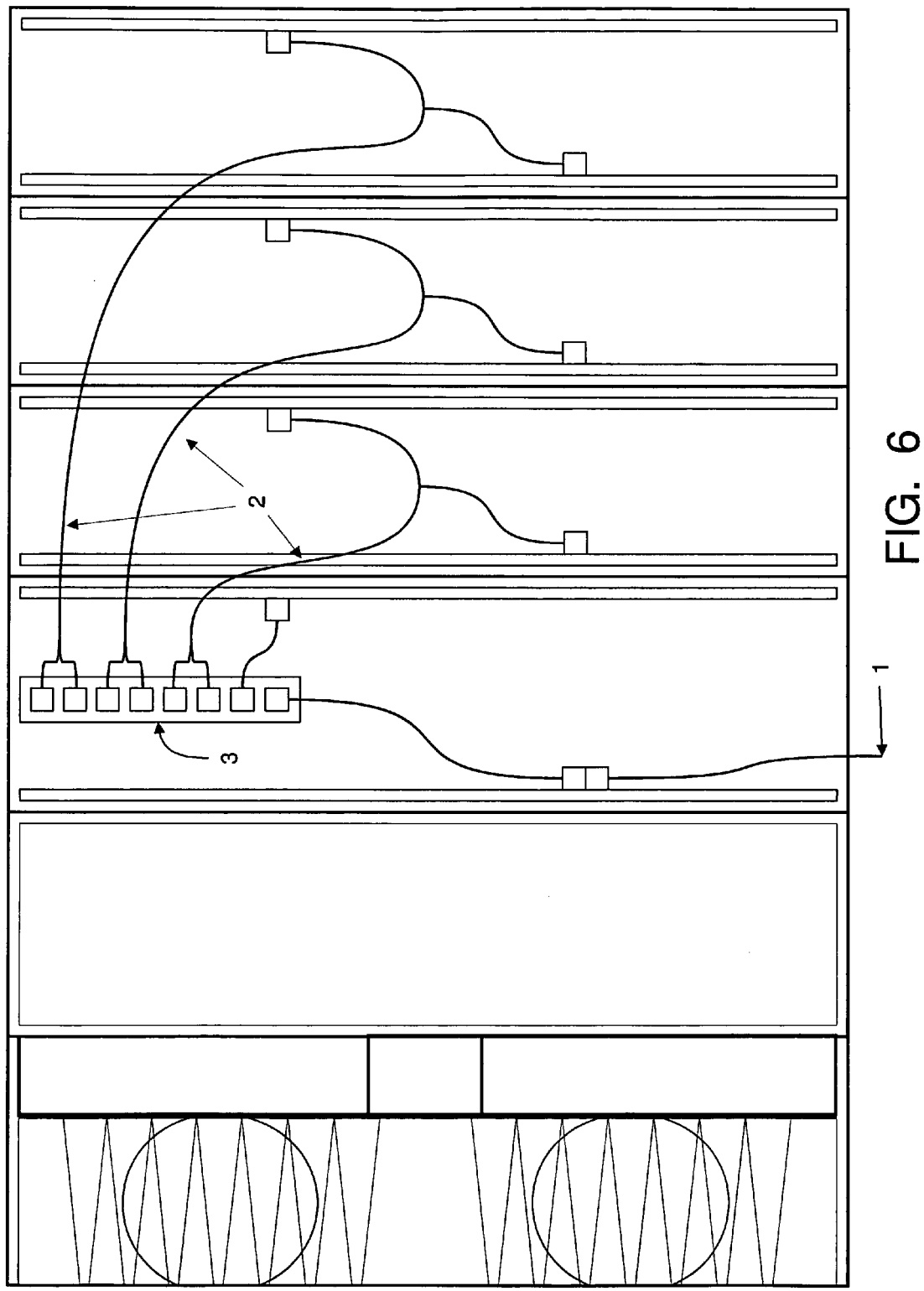

FIG. 6: TOP VIEW with network connections

This figure shows the invention from the top along with the network connections. There are no opaque case panels in this figure to obscure the view of the internal components. The labeled items are as follows:
 1: Network cable to the outside
 2: Network cables connecting the switch to each motherboard (There is a single cable between each port on the switch and each motherboard. Each two cables going to the same chamber are bundled together and then splitting before connecting to the motherboards.)

3: High-speed network switch

This figure is similar to FIG. B, but with network connections displayed. The actual network wires will run along tighter paths than those displayed in the figure. Their paths have been exaggerated for the purpose of clarity. The important detail is that each network cable connects one motherboard network port to the switch (3), with one exception—the wire that connects the main motherboard to the outside network (1).

Figure 7:
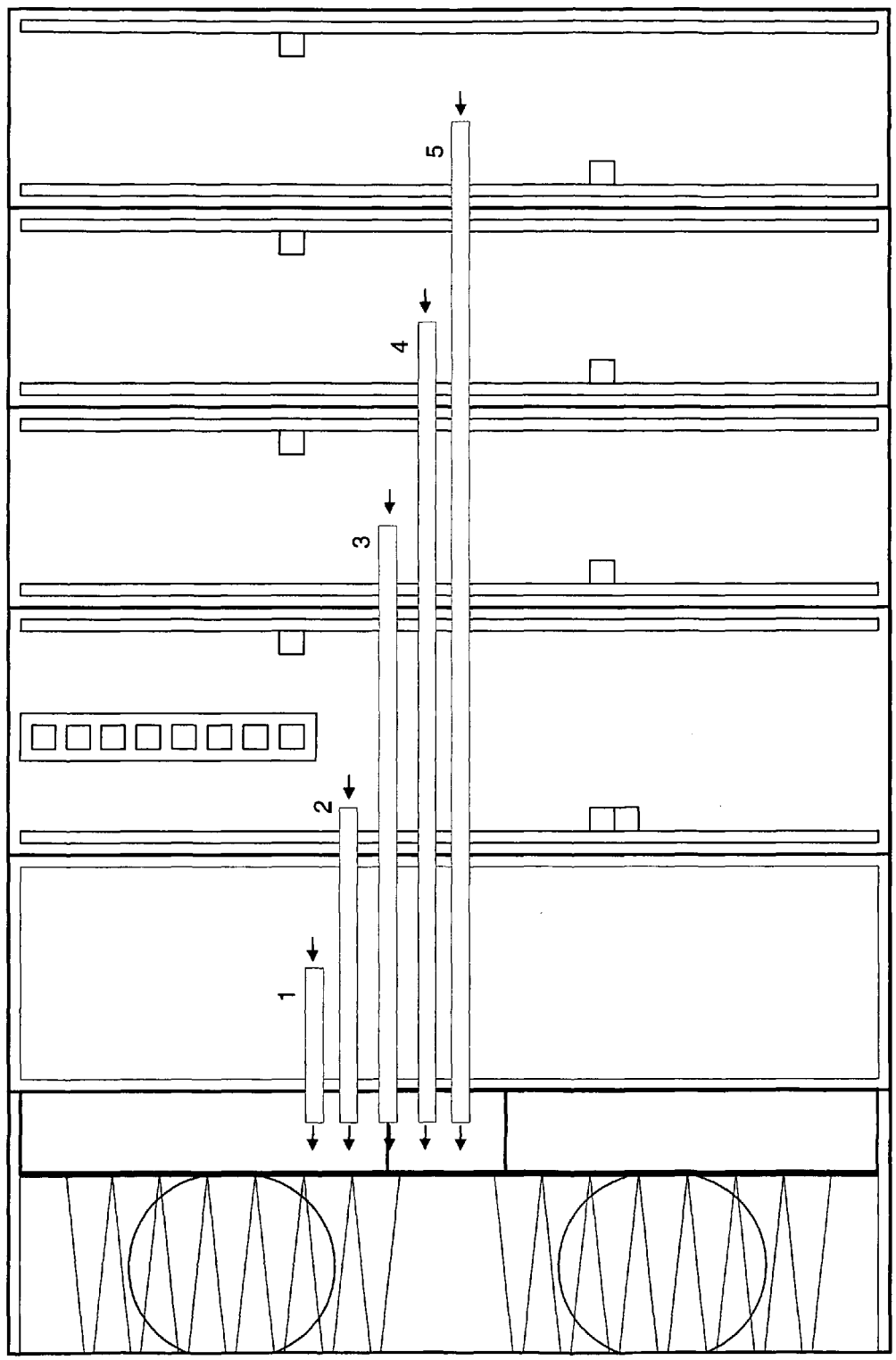

FIG. 7: TOP VIEW with coolant conduits

This figure shows the invention from the top along with conduits for the liquid coolant. There are no opaque case panels in this figure to obscure the view of the internal components. The labeled items are as follows:

1: Tube carrying coolant from the power supply to the First Cooling Chamber
   2: Tube carrying coolant from the first motherboard chamber to the First Cooling Chamber
   3: Tube carrying coolant from the second motherboard chamber to the First Cooling Chamber
   4: Tube carrying coolant from the third motherboard chamber to the First Cooling Chamber
   5: Tube carrying coolant from the fourth motherboard chamber to the First Cooling Chamber This figure is similar to FIG. B, but with coolant conduits displayed. The actual coolant tubes will run along different paths that those displayed in the figure. Their paths have been simplified for the purpose of clarity. The important detail is that each conduit carries liquid from each motherboard chamber to the First Cooling Chamber.

Figure 8:
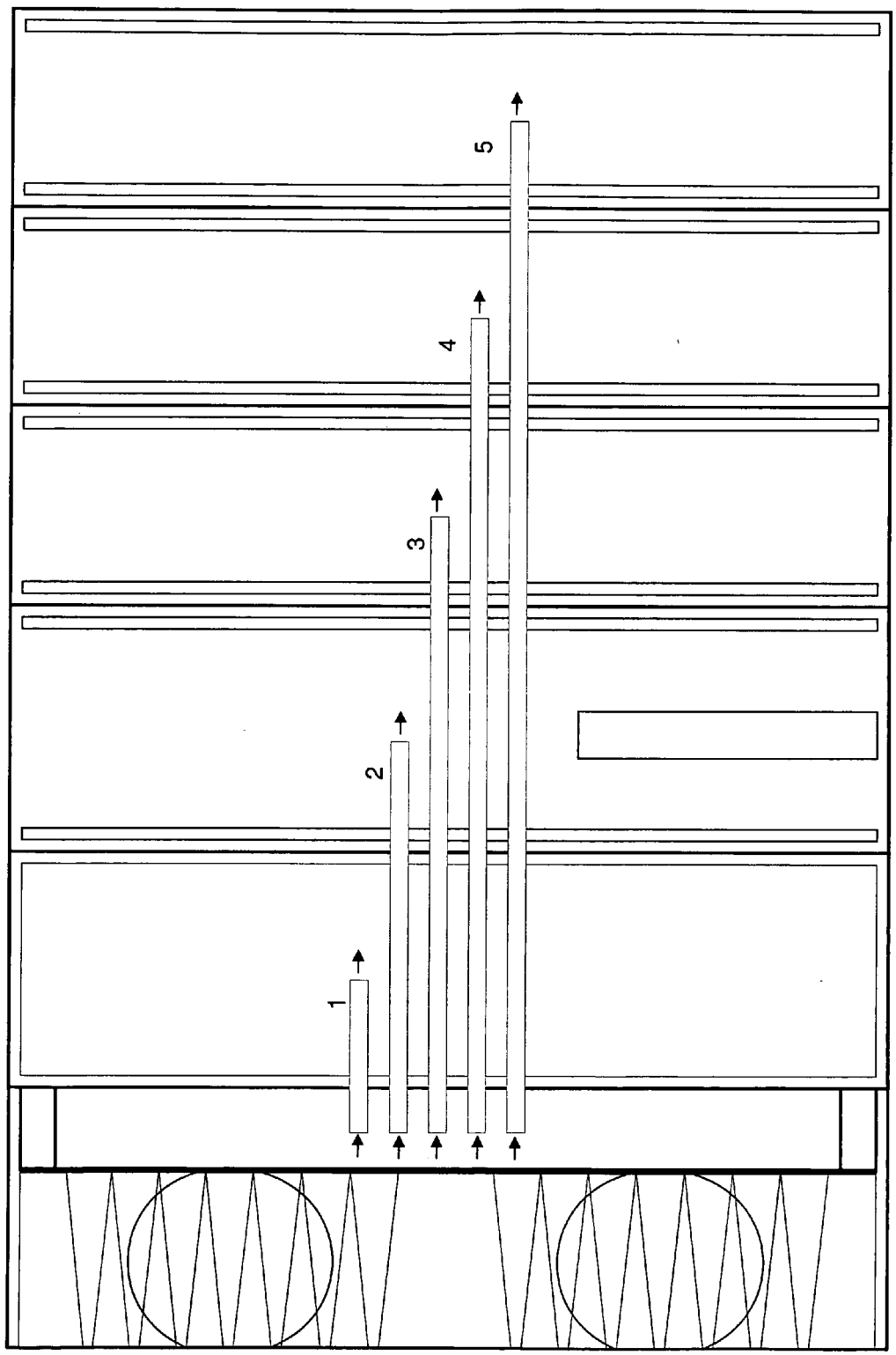

FIG. 8: BOTTOM VIEW with coolant conduits

This figure shows the invention from the bottom along with conduits for the liquid coolant. There are no opaque case panels in this figure to obscure the view of the internal components. The labeled items are as follows:

1: Tube carrying coolant from the pump to the power supply
   2: Tube carrying coolant from the pump to the first motherboard chamber
   3: Tube carrying coolant from the pump to the second motherboard chamber
   4: Tube carrying coolant from the pump to the third motherboard chamber
   5: Tube carrying coolant from the pump to the fourth motherboard chamber This figure is similar to FIG. E, but with coolant conduits displayed. The actual coolant tubes will run along different paths that those displayed in the figure. Their paths have been simplified for the purpose of clarity. The important detail is that each conduit carries liquid from the pump to the bottom of each motherboard chamber.

Figure 9:
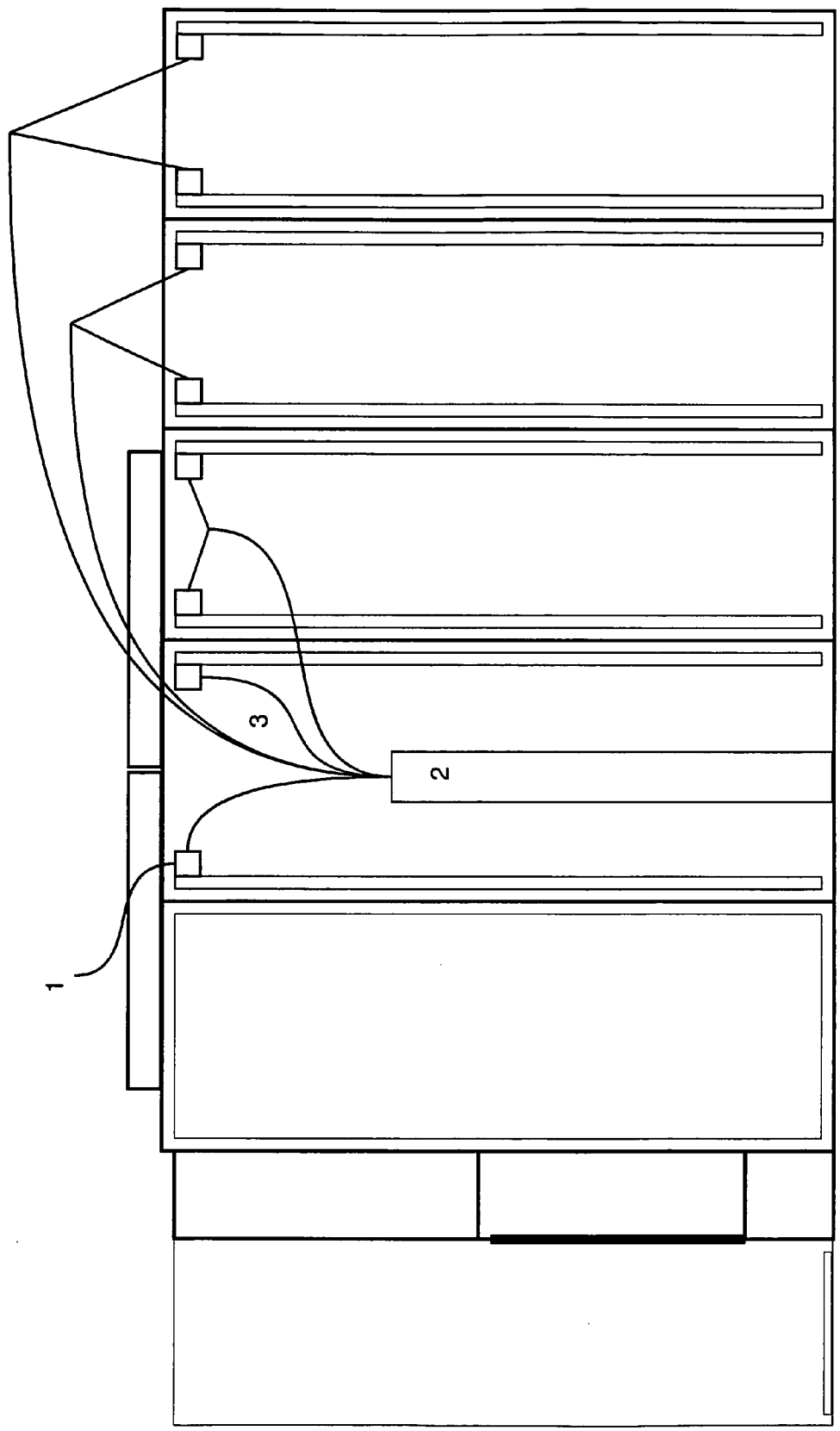

FIG. 9: FRONT VIEW with network connections

This figure shows the invention from the front along with network connections. There are no opaque case panels in this figure to obscure the view of the internal components. The labeled items are as follows:

1: Network connection to the outside
   2: High-speed network switch
   3: Network cables connecting the switch to each motherboard This figure is similar to FIG. C, but with network connections displayed. The actual network wires will run along tighter paths than those displayed in the figure. Their paths have been exaggerated for the purpose of clarity. The important detail is that each network cable connects a network port to the switch (2), with one exception—the wire that connects the main motherboard to the outside network (1).

Figure 10:
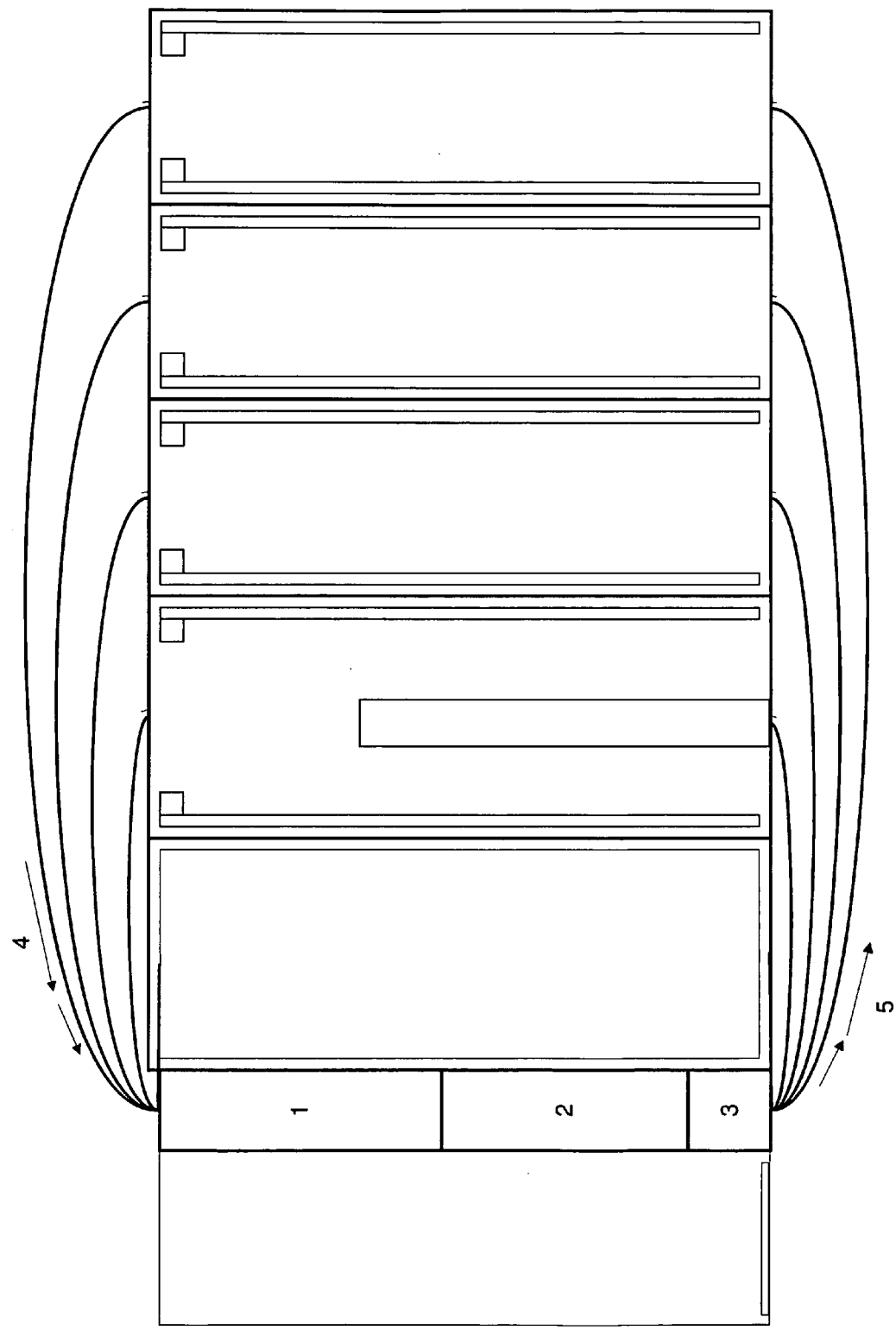
Figure 11:
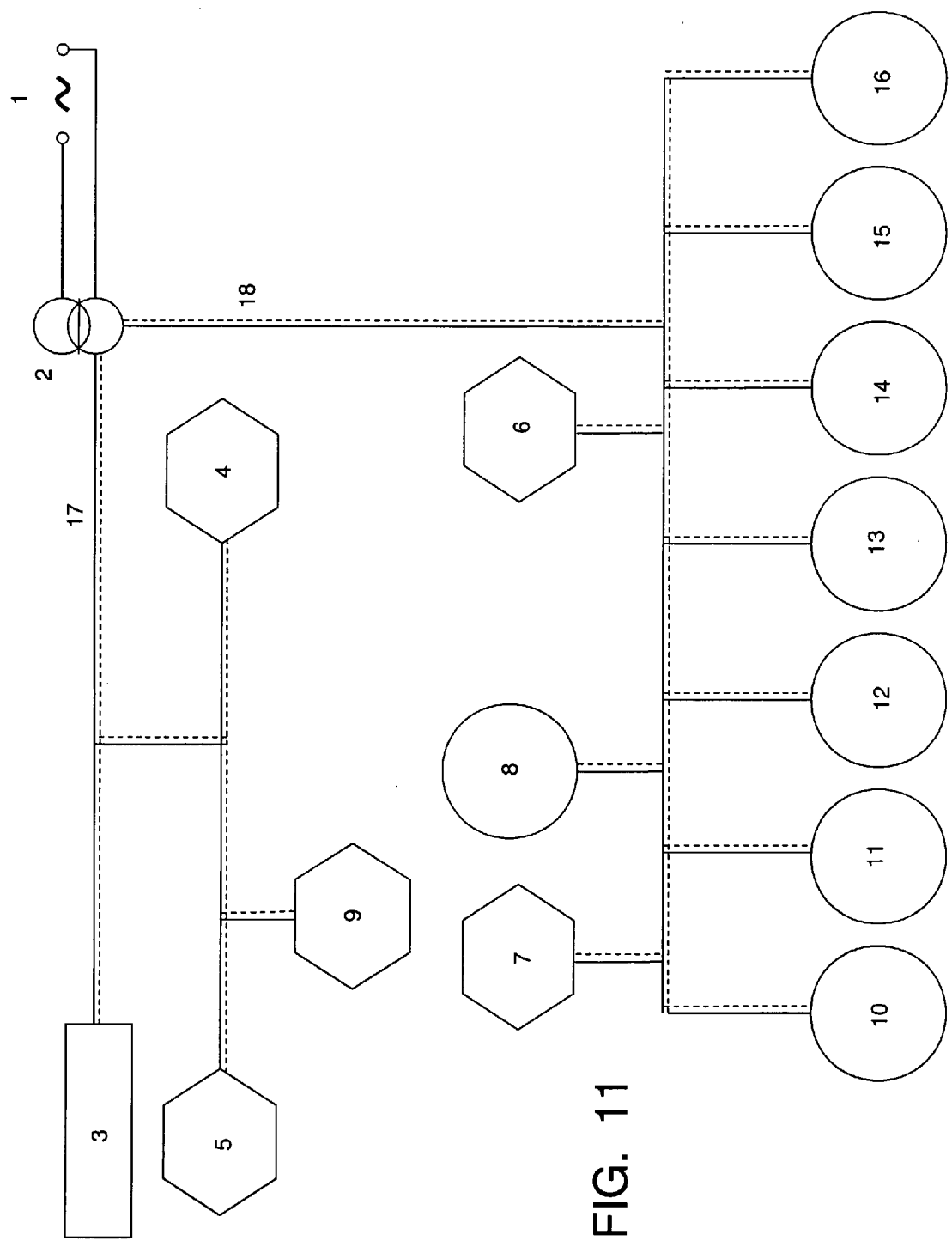
Figure 12:
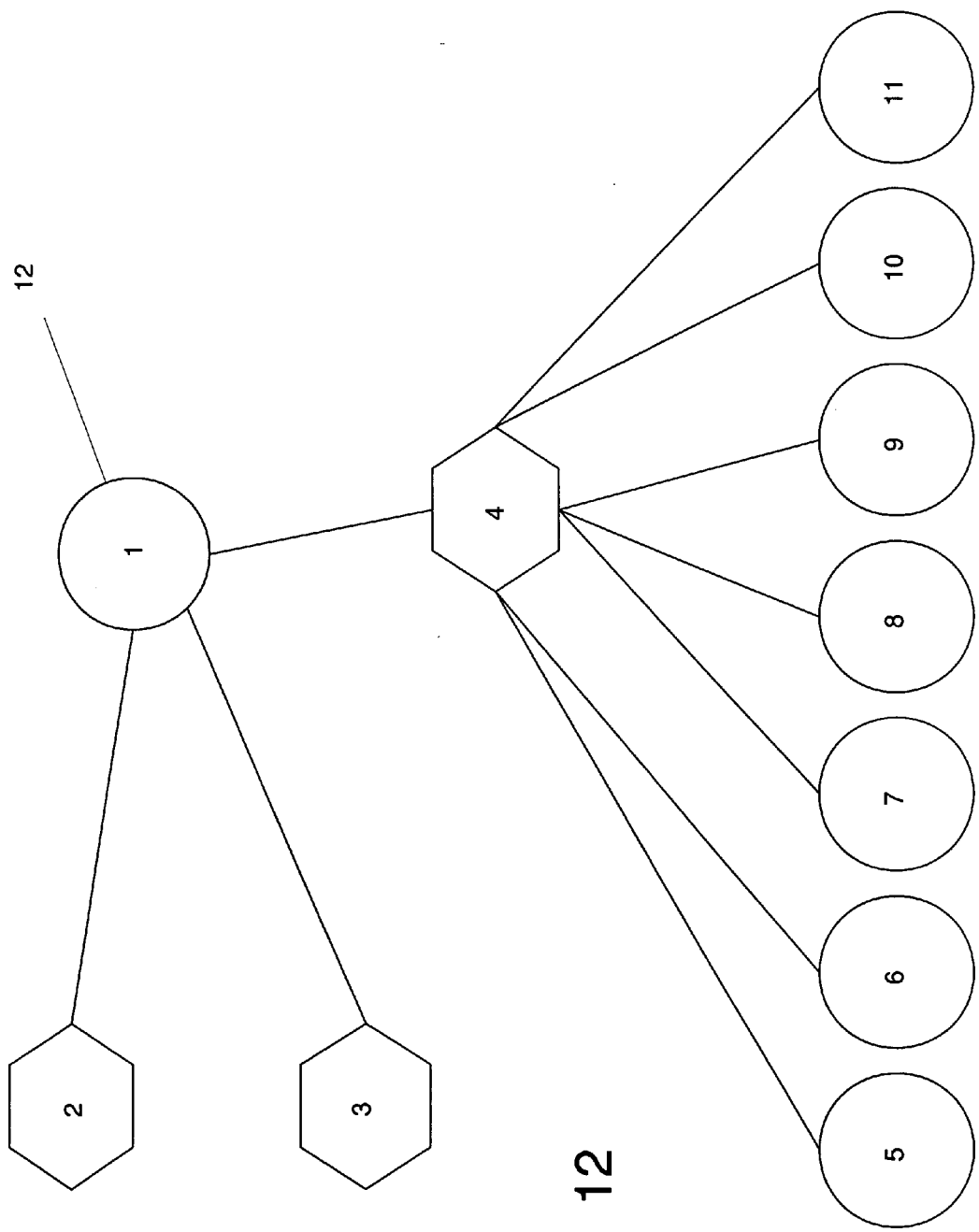
Figure 13:
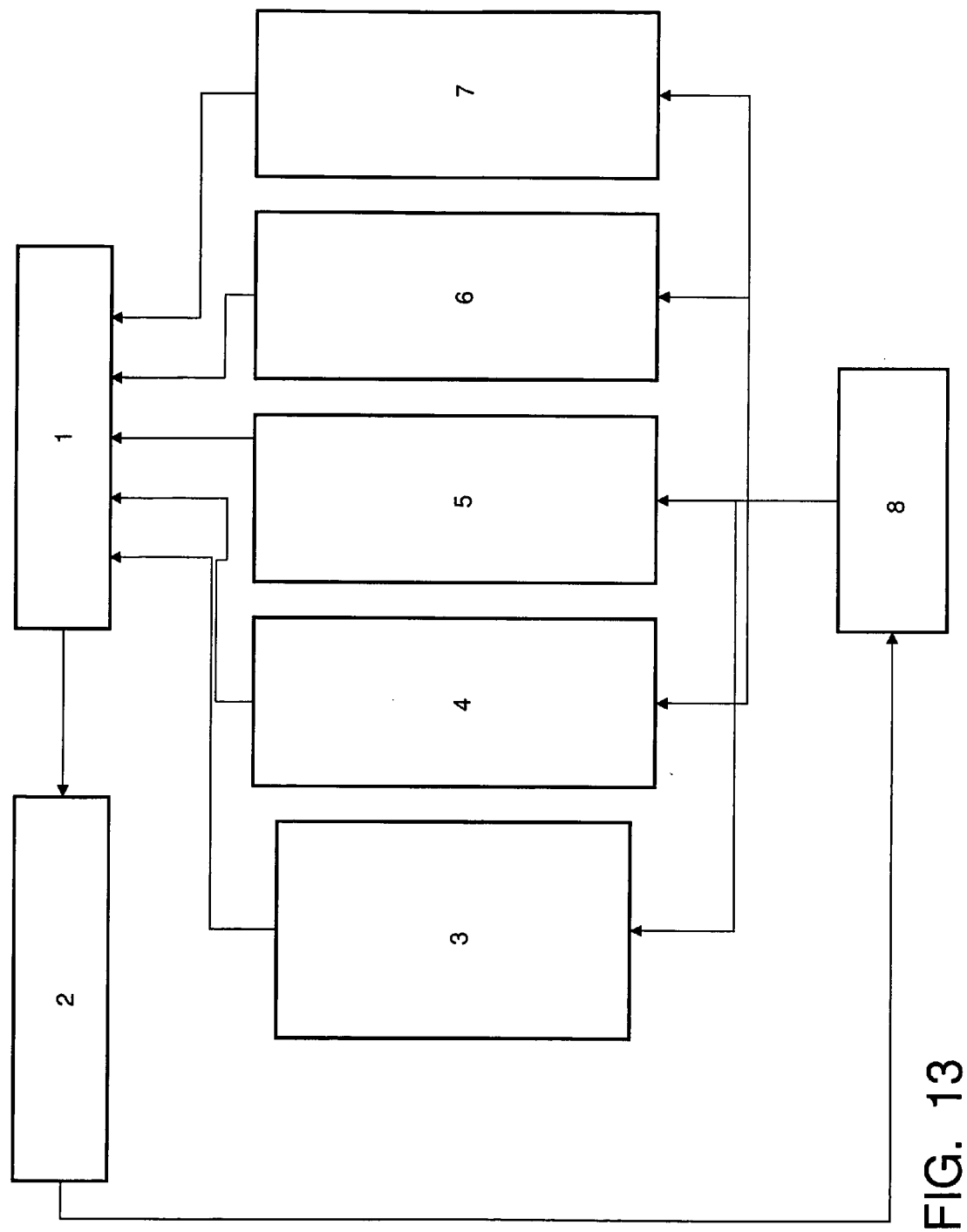
Figure 14:
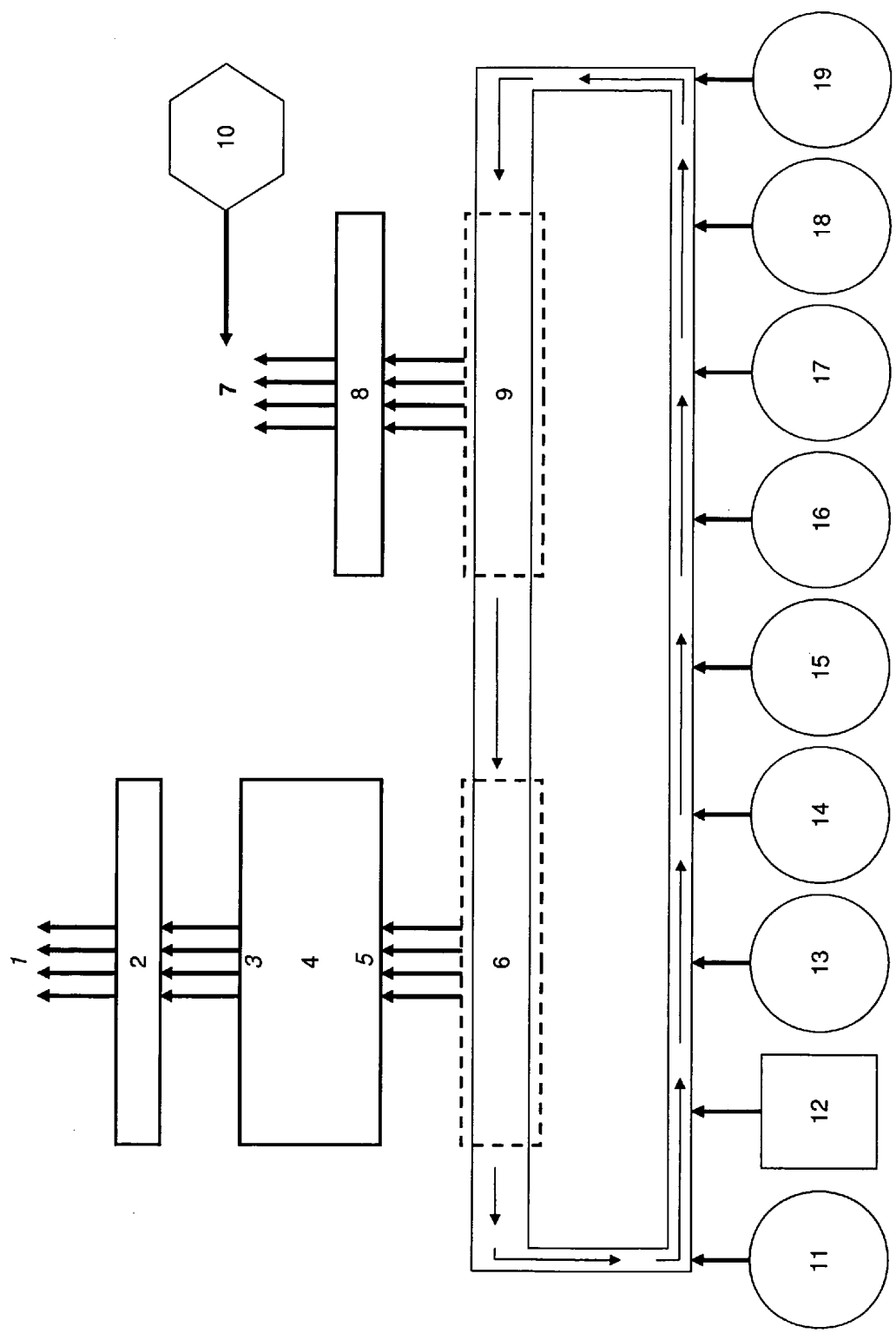

FIG. 10: FRONT VIEW with coolant conduits

This figure shows the invention from the front along with conduits for the liquid coolant. There are no opaque case panels in this figure to obscure the view of the internal components. The labeled items are as follows:

1: First Coolant Chimney
   2: Second Coolant Chimney
   3: Pump
   4: Conduits carrying liquid coolant from the components to the First Cooling Chamber
   5: Conduits carrying liquid coolant from the pump to the components This figure is similar to FIG. (3), but with coolant conduits displayed. The actual coolant tubes are shown as lines for the purpose of simplifying the figure. They will in actuality be wider than they appear here and will run along tighter paths than those displayed in the figure. Their paths have been exaggerated for the purpose of clarity. The important detail is that each conduit carries liquid either from the components to the first cooling chamber (These conduits are above the components), or from the pump to bottom of each chamber (Below the components).

FIG. 11: ELECTRICAL CONFIGURATION

This figure shows the electrical configuration of the invention. Objects in this figure are only symbolic. The labeled items are as follows:

1: AC Power source
   2: Power Supply Unit
   3: Peltier-effect Coolers
   4: 8-port Network Switch
   5: Pump
   6: Optical Drive
   7: Hard Drive
   8: Main Motherboard
   9: Fans
   10-16: Motherboards 2-8
   17: 12 Volt line
   18: 5 Volt line The invention draws its power from a standard AC power source (1). A Power Supply Unit (2) converts the AC power into the numerous DC voltages that are necessary for standard PC motherboards and components. Among these voltages is a 12V DC line (17) which powers the Peltier-effect coolers, the pump, the 8-port network switch, and the fan. The other DC line (18), which carries multiple voltages, is connected to each motherboard. The Hard Drive and Optical Drive are also powered off of this line. In most cases, these drives will only require two of the various voltages required by motherboards.

FIG. 12: LOGICAL CONFIGURATION

This figure is a symbolic diagram meant to show relationships between components of the invention. It shows the logical configuration of the invention, in other words, the relationship between logic processing/transmitting components. Objects in this figure are only symbolic. The labeled items are as follows:

1: Main Motherboard
   2: Optical Drive

3: Hard Drive
4: 8-port Switch
5-11 Motherboards 2-8
12: User Interface

Displayed are the logical relationships between the information processing components of the invention. Both the Optical Drive and the Hard Drive are connected directly to the Main Motherboard. All interaction with these devices is done through the Main Motherboard. When another motherboard needs to access files on the Hard Drive, this access is granted via a virtual file system. All communication between motherboards occurs through the network switch (4) and network cables. For some software configurations the slaved motherboards (Motherboards 2-8) will communicate only with the Main Motherboard, while other software configurations allow any two processes to communicate, no matter on which motherboard they may be running. The user interacts with the main motherboard.

FIG. 13: COOLANT CONFIGURATION

This figure is another symbolic diagram. It shows the coolant configuration of the invention. Objects in this figure are only symbolic. The labeled items are as follows:
1: First Cooling chamber
2: Second Cooling chamber
3: Power Supply Unit
4-7: Chambers 1-4
8: Pump The arrows in this figure represent the flow of liquid coolant from one component to the next. The cycle is as follows: The pump draws liquid from the Second Cooling Chamber (2) and sends it to the PSU (3) and Chambers 1-4 in parallel. These chambers contain heat generating components. After passing through the PSU and Chambers 1-4, the heated liquid flows into the First Cooling Chamber (1). From this chamber it then flows back to the Second Cooling Chamber, thus completing the cycle.

FIG. 14: THERMAL CONFIGURATION

This figure is another symbolic diagram. It shows the thermal configuration of the invention. Objects in this figure are only symbolic. The labeled items are as follows:
1, 7: The Environment
8: Air Chimney 1
2: Air Chimney 2
4: Layer of thermoelectric coolers
9: Coolant Chimney 1
6: Coolant Chimney 2
11: Main motherboard
10: Hard and Optical Drives
12: 'Other components'

The thicker arrows in this figure represent the transference of heat. The enclosed area with thinner arrows represents the flow of liquid through the cycle described by FIG. M. All the heat-generating components of the invention are located at the bottom, with the exception of the Optical and hard Drives. These do not create much heat relative to the other components. They are in thermal contact with the environment, so they can emit heat to the environment directly, bypassing the liquid coolant that circulates through the rest of the invention. In the invention, the liquid passes to numerous components in parallel, but for the simplicity of this figure the liquid is shown to pass by all the heat-generating components in one stream at the very bottom. Once the liquid has absorbed the excess heat of these components, it passes through the First Cooling Chamber, where much of this heat is expressed to the environment. After that it passes through the Second Cooling Chamber, which allows it to be further cooled because this chamber is in thermal contact with the cold interface of a layer of thermoelectric coolers.

Figure 15:
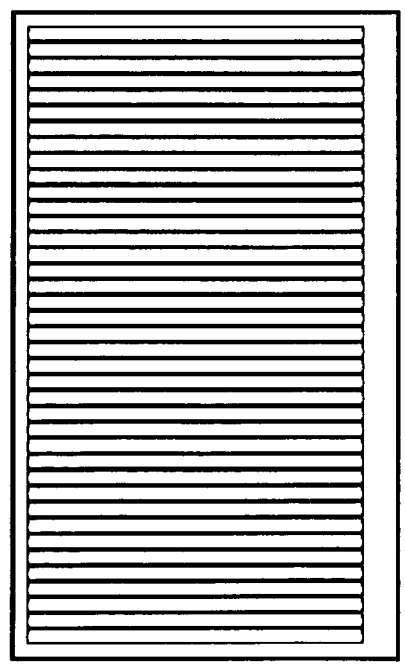

FIG. 15: COOLANT CHIMNEYS—Internal configuration from side view

This figure shows the internal configuration of a coolant chimney as if viewed from the right side of the invention. In this embodiment it is not as tall as the air chimneys. There are two coolant chimneys in this invention, and they are identical in their internal configurations. Their positions can be seen in FIG. D. The only difference between the two is their placement and which components they contact. The internal heatsink fins can be seen. These fins are vertically oriented. Instead of expelling heat, their purpose is to absorb the heat of the passing liquid and/or condensing coolant. This heat is passed to the left surface where it either enters the environment directly, as in the case of the First Cooling Chamber, or it is convexed to the layer of thermoelectric coolers, as in the case of the second Cooling Chamber, which acts as a heat pump.

Figure 16:
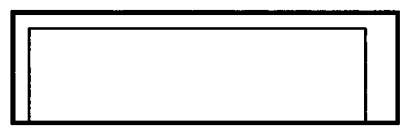

FIG. 16: COOLANT CHIMNEYS—Internal configuration from front view

This figure shows the internal configuration of a coolant chimney as if viewed from the front of the invention. Only the side of an internal fin can be seen.

Figure 17:
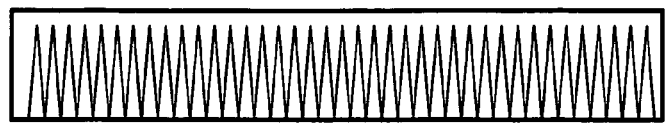

FIG. 17: COOLANT CHIMNEYS—Internal configuration from top view

This figure shows the internal configuration of a coolant chimney as if viewed from the top of the invention. The top of each heat sink fin can be seen on edge. They are all vertically aligned. The left side is the side that abuts against the first Air Chimney, as in the case of the first Coolant Chimney, or against the layer of thermoelectric coolers, as in the case of the second Air Chimney.

FIG. 18: MOTHERBOARD CHAMBER (closeup)

This figure shows a closeup of a motherboard chamber (The entirety of which can be seen in FIG. S). There is one labeled item:
1: Motherboard groove This figure is a closeup of one of four grooves that runs up the internal side of each motherboard chamber. The edge of the motherboard fits into that groove. The fit should be loose enough so as not to put pressure on any motherboard component.

FIG. 19: MOTHERBOARD CHAMBER

This figure shows a motherboard chamber, an essential component of the invention. The labeled items are as follows:
1: Motherboard grooves
2: Top of Motherboard groove, and location magnified in FIG. R
3: Entry point for liquid coolant
4: Exit point for liquid coolant Each motherboard chamber houses two motherboards, and each of these motherboards slides in and out of vertical grooves (1). The notched design of these grooves can be seen in FIG. R. This design makes the motherboards simple to replace or service once the top of the case is opened. In the very bottom center of the chamber (3) is the entry point for the liquid coolant. The exit point is located at the top (4).

Figure 20:
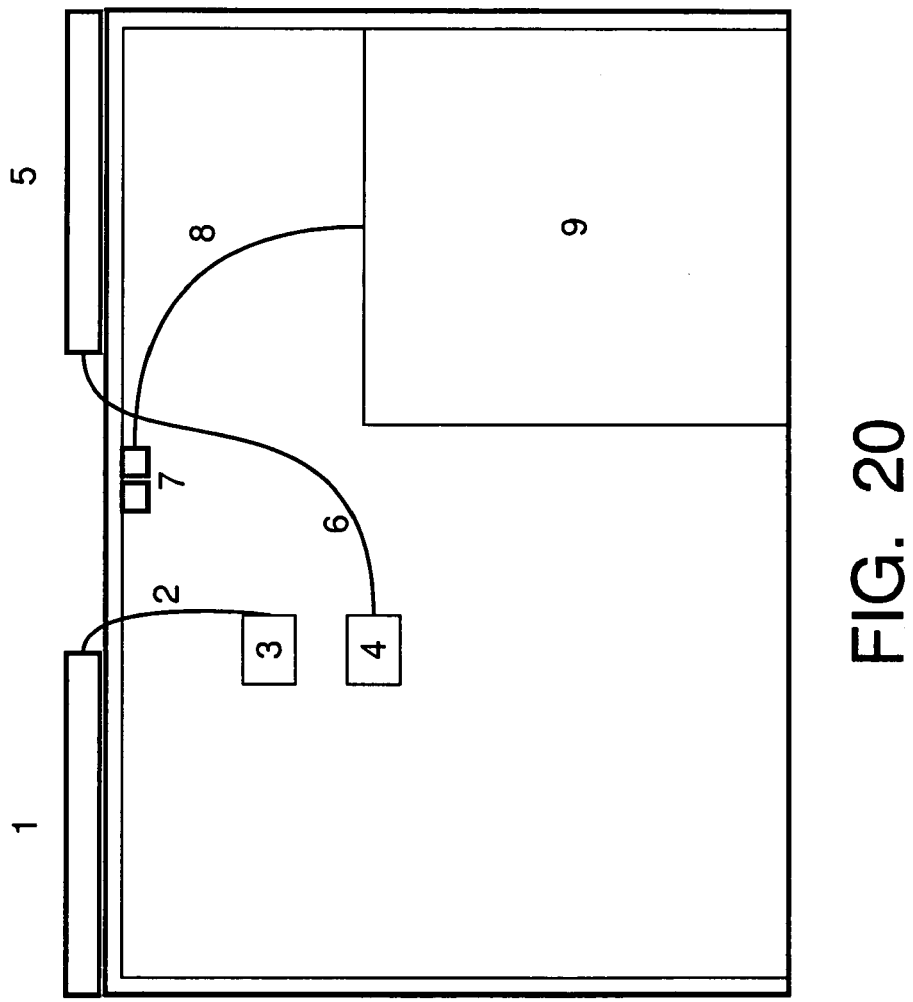
Figure 21:
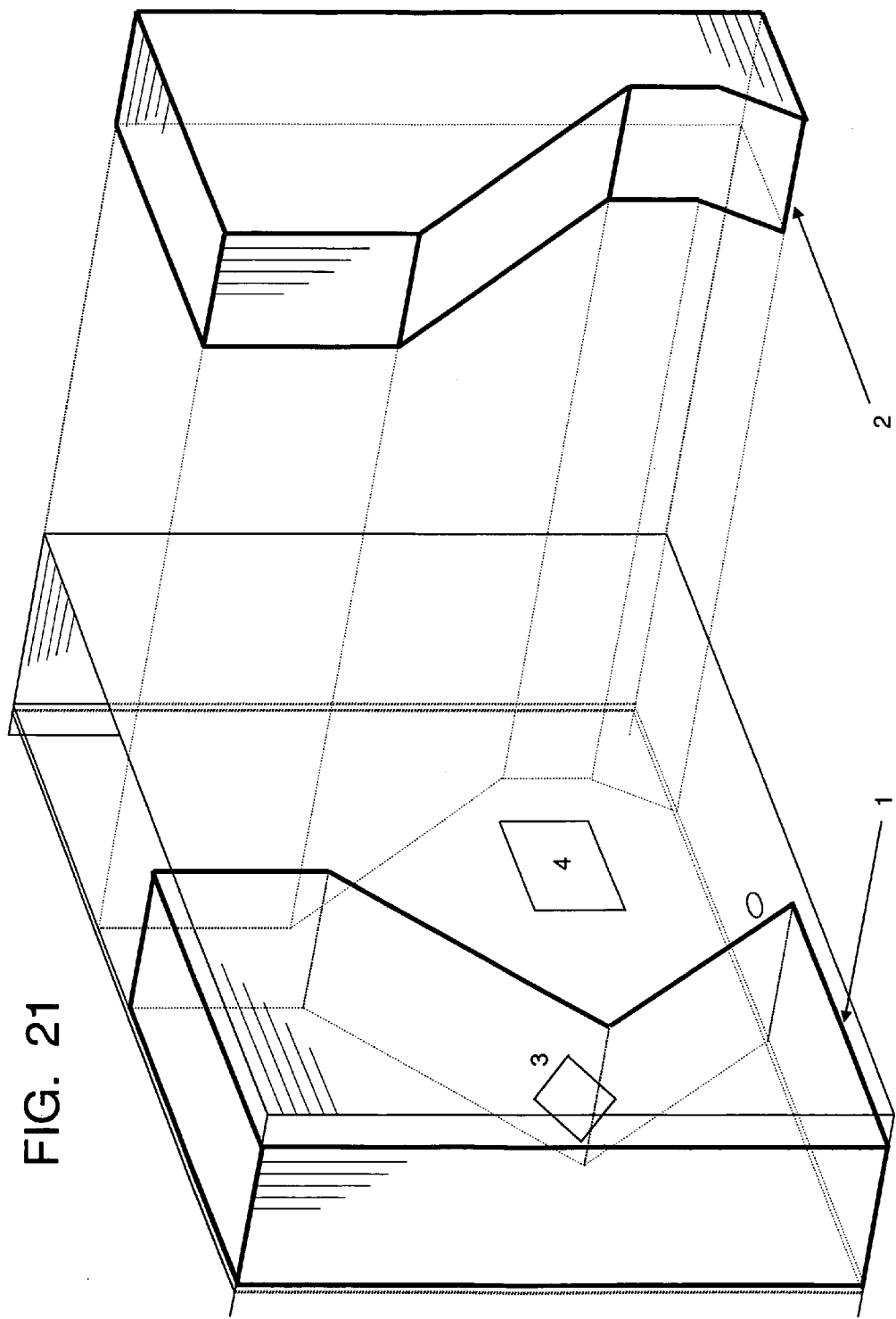
Figure 25:
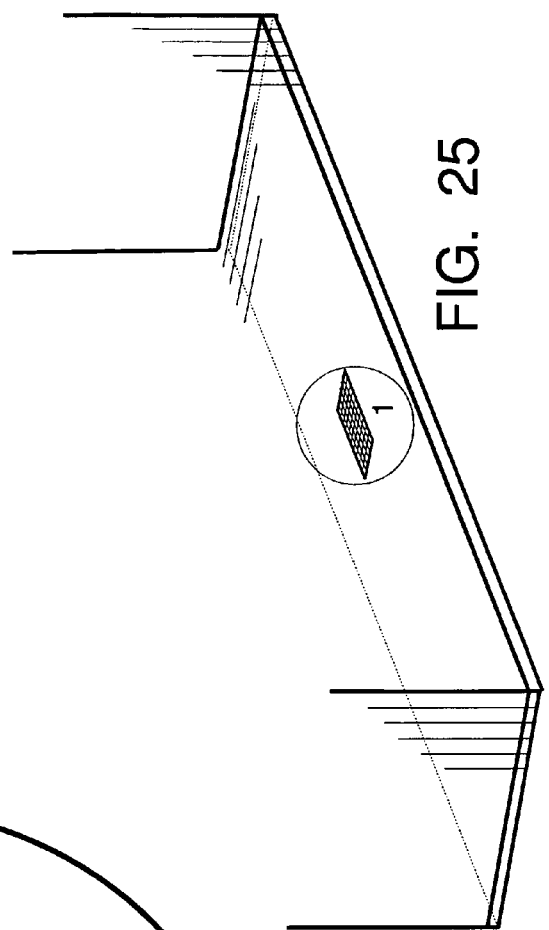

FIG. 20: MAIN MOTHERBOARD CHAMBER with Main Motherboard (Important connections)

This figure shows the motherboard chamber with only the Main Motherboard, optical drive, hard drive, and switch installed. The view is from the right. The positions of the components are not accurate. The purpose of this figure is merely to show connections. The labeled items are as follows:
 1: Optical Drive
 2: Connection from Optical Drive to motherboard
 3: On-board connection for Optical Drive
 4: On-board connection for Hard Drive
 5: Hard Drive
 6: Connection from Hard Drive to motherboard
 7: Network ports
 8: Network connection from main motherboard to switch
 9: High-speed switch The preferred embodiment has off-board memory devices connected solely to the Main Motherboard. This figure shows that both the Optical Drive (1) and the Hard Drive (5) are connected directly to the motherboard. This motherboard is connected to the rest of the invention through the network, which is accessed through the switch (9) which is connected via the cable (8) to one of the network ports (7).

FIG. 21: MOTHERBOARD CHAMBER INSERTS

This figure shows a motherboard chamber with inserts that enable the efficient flow of the liquid coolant while minimizing the overall volume of liquid necessary for covering the surface of the motherboard. The inserts will be made of a material that is both lighter and cheaper than the liquid coolant. The labeled items are as follows:
 1: An example of an insert installed in the chamber
 2: Another example of an Insert and how it fits inside the chamber
 3: Chipset
 4: CPU Since each motherboard must be covered in the liquid coolant, the chamber has the potential to be heavy and require much liquid flow in order to efficiently cool everything. Inserts can fill some of the space between the motherboards and the sides of the chamber so that considerably less liquid is required to fill the chamber and the liquid flow is focused on the components that generate more heat. In this figure, two major heat-generating components are shown: the CPU (4), and the on-board chipset (3). This is merely an example to show the purpose of these inserts. Each motherboard has major heat-generating components in different places. The inserts would need to be custom-made for each motherboard. In the situation depicted here, two inserts are shown. The insert on the left (1) is installed so that it guides the liquid up and around the on-board chipset. The insert on the right (2) is extracted to show its shape. There are guidelines which show how it fits into the motherboard chamber. It's purpose is to guide the flow of liquid up and around the CPU while taking up as much empty space as possible.

FIG. 22: MOTHERBOARD CHAMBER cable exit point and cover

This figure shows a configuration for the exit point of the cables which connect the two motherboards inside a given chamber with other components. The labeled items are as follows:
 1: Chamber cover
 2: Network to first motherboard
 3: Network to second motherboard
 4: Power to first motherboard
 5: Power to second motherboard Since each motherboard chamber is filled with liquid coolant, it is important to make the chamber airtight and liquidtight so that no liquid or gas is lost—some of the liquid coolant may boil during operation. It is essential to the invention that the motherboard chambers be liquidtight and airtight. It is also essential that the motherboards be connected by cables to components that are not in the chamber. Connections as such require that the cables perforate the chamber without breaking the overall seal. It is also essential to the invention that the motherboard chamber have an easily removable cover on top. This cover must be removed in order to replace or service the motherboards. One configuration which satisfies each of these essentials is the configuration shown in this figure. A cover is made such that it can close tightly with the rest of the case with the help of a sealing agent such as a rubber gasket running along the edge between itself and the rest of the case (1), and a fastening agent such as screws or latches to hold it down (not pictured). The choice of fastening agent is not important, as long as it is effective.

FIG. 23: MOTHERBOARD CHAMBER cable exit point closeup

This figure shows a closeup of the exit point of the cables which connect the two motherboards inside a given chamber with other components. The labeled items are as follows:
 1: Watertight entry point The cables exit the case via the cover through a gasket (1). There are four cables that must leave each chamber: two power cables, and two network cables. All of these cables are shown exiting the chamber through this gasket. The Main Motherboard chamber is a special case. It will have more cables exiting through its cover than are pictured here—two power cables and six network cables (going to the other motherboards), and the data cables to the Optical and Hard Drives.

Figure 24:
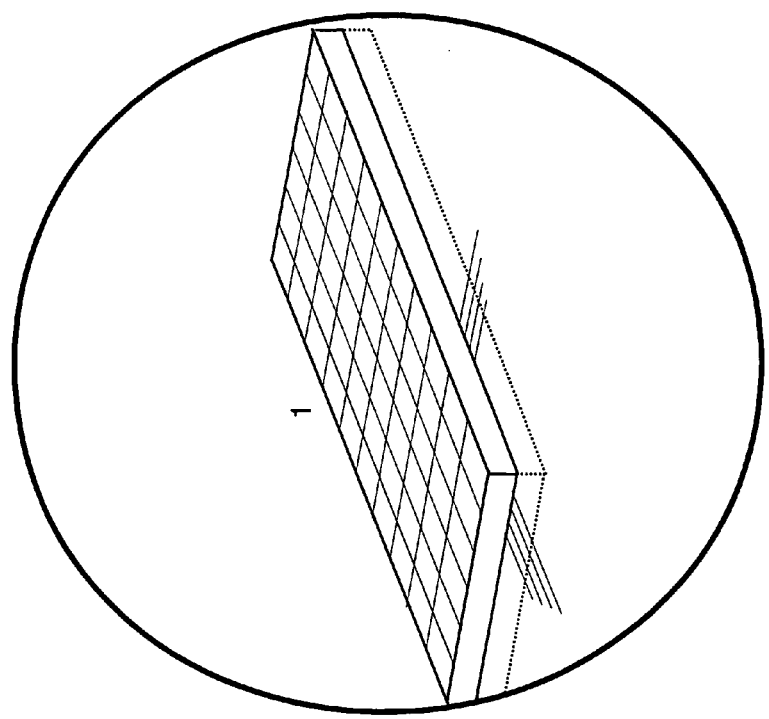

FIG. 24: MOTHERBOARD CHAMBER CONNECTOR closeup

This figure shows a closeup of an alternate configuration for the exit and entry point of the cables and conduits which connect the each chamber with other components. Instead of cables or conduits perforating the surface of the chamber, a plug or set of plugs exists as part of the chamber's surface. The plug has many versatile ports. Some are electrical conduits and some are liquid conduits that can act as valves. The side shown may not necessarily be the bottom. Such a plug could be incorporated into any side of a chamber, but should only be in one side, as to facilitate removal of the whole chamber by merely "unplugging" it. The labeled items are as follows:
 1: MULTIUSE CONNECTOR This connector, if used, replaces the exit point from FIG. V. All cables or conduits that must enter a given chamber will go through this multiuse connector. It is shown with 60 separate ports. This number is arbitrary and can be altered to suit the needs of a given set of components. Some ports will be bigger than others and may have a different construction. The ports for the entry and exit of the liquid coolant will act as valves. When disconnected, the liquid will be prevented from flowing in either direction. The appropriate flow of liquid from bottom to top will be handled inside the chamber by methods not shown here.

FIG. 25: MOTHERBOARD CHAMBER CONNECTOR

Figure 26:
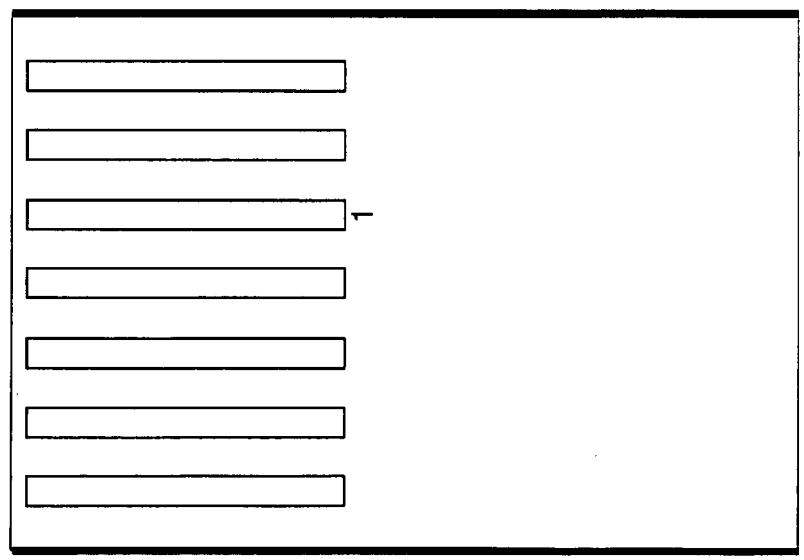

This figure merely shows a possible location for the connector from FIG. X. The labeled items are as follows:
 1: MULTIUSE CONNECTOR FIG. 26: AIR CHIMNEY 1: Internal configuration (Left side view)

Figure 27:
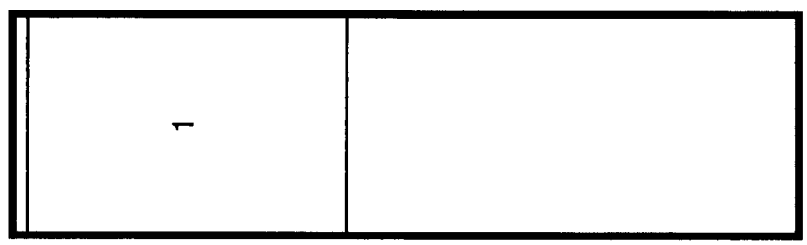

This figure shows the internal configuration of the first air chimney. This is the first vertical passage for ambient air flowing upward. There are two in this invention, and they are similar in their internal configurations. Each "air chimney" vertically runs the entire height of the invention, but each "coolant chimney" is only half the height of the invention. This air chimney is meant to receive heat from the first coolant chimney, which is behind it at the top half. That is why there are fins only along the top half of this air chimney. One of the fins is labeled:
1. Extruded fin FIG. 27: AIR CHIMNEY 1: Internal configuration (Front side view)

Figure 28:
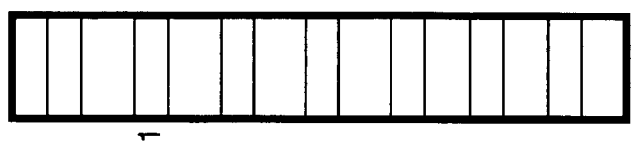

This figure shows the internal configuration of the first air chimney from the front. The one fin that is visible is labeled:
1. Extruded fin FIG. 28: AIR CHIMNEY 1: Internal configuration (Top side view)

Figure 29:
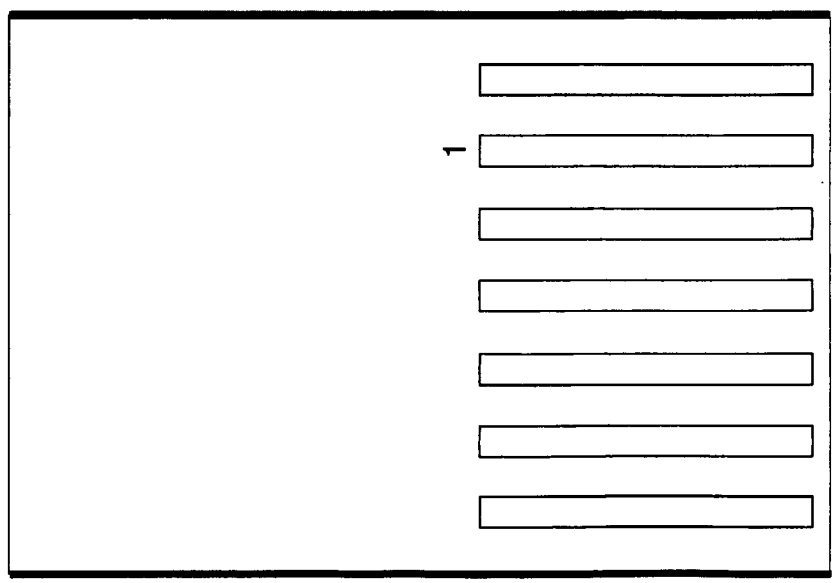

This figure shows the internal configuration of the first air chimney from the top. One of the fins is labeled:
1. Extruded fin FIG. 29: AIR CHIMNEY 2: Internal configuration (Left side view)

Figure 30:
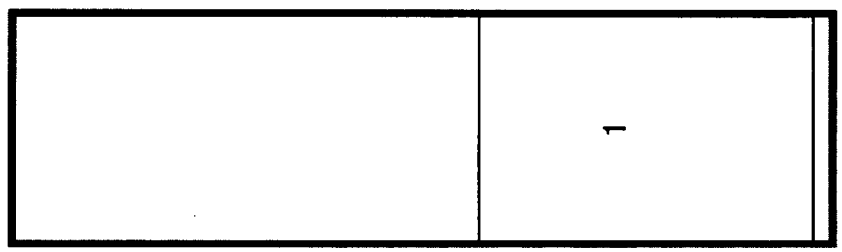

This figure shows the internal configuration of the second air chimney. This is the second vertical passage for ambient air flowing upward. There are two in this invention, and they are similar in their internal configurations. Each "air chimney" vertically runs the entire height of the invention, but each "coolant chimney" is only half the height of the invention. This air chimney is meant to receive heat from the second coolant chimney, which is behind it at the bottom half. That is why there are fins only along the bottom half of this air chimney. One of the fins is labeled:
1. Extruded fin FIG. 30: AIR CHIMNEY 1: Internal configuration (Front side view)

Figure 31:
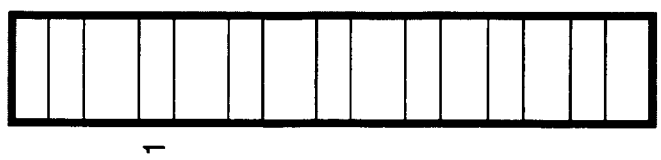

This figure shows the internal configuration of the second air chimney from the front. The one fin that is visible is labeled:
1. Extruded fin FIG. 31: AIR CHIMNEY 1: Internal configuration (Top side view)

This figure shows the internal configuration of the second air chimney from the top. One of the fins is labeled:
1. Extruded fin

SUMMARY OF THE INVENTION

The purpose of the invention is to be a computationally powerful, small form-factor, easily-serviceable supercomputer with a simple interface, built with off-the-shelf electronic components. The invention is an improvement upon prior art when all these factors are considered.

To achieve its computational power, the invention incorporates numerous high-end processors. The invention has at least one motherboard, but most embodiments will have multiple motherboards. Each motherboard has at least one processor (i.e. "chip"), but for most embodiments, each motherboard will have multiple processors. Each processor has at least once core, but for most embodiments, multiple core processors will be used—as many cores as are allowed by factors such as application parameters and presently technology. The preferred embodiment, according to presently available technology, employs 8 motherboards, each having 4 dual-core processors.

The power of the invention is further increased by overclocking each of its processors. Each chip has a factory clock-speed setting. The BIOS of the motherboard sets the speed at which it will run the chip. Normally, if you run a chip faster than the factory default, you will create too much heat in the chip (from electrical resistance), and the chip will burn out. Some chips have thermostats which enable them to self-limit their processing speed so that they don't burn out. In either case, it's difficult to make a chip go faster than its factory default. However, if you supply the chip with the correct voltages, and you are able to sink away more heat than a standard cooling system, you will be able to run the chip at a faster speed than the factory default.

To achieve a small form-factor, the invention packs motherboards so that they are coplanar. Special heatsinks are chosen for the CPUs so that their height off of the board surface will be as little as possible. That way, each two motherboards can be packed, facing each other, as closely together as possible in a "motherboard chamber". The greatest difficulty in building a small form-factor computer is expelling enough heat so that the system can function properly. This problem is exacerbated by overclocking. This invention expels heat by first transferring heat to a liquid coolant that runs throughout the chambers with the motherboards, and then the coolant carries that heat to the heatsink chimneys, which expel the heat to the environment. The point makes the present invention different from the Cray-2, which also submerged electronic components in liquid coolant, is that the Cray required a continuous supply of chilled water through its heat exchanger. The present invention expels almost of all its heat through the heatsink chimneys.

The invention can have a plurality of heatsink chimneys, but they come in pairs—one for the coolant flowing downward and one for ambient air flowing upward. They will be referred to as the coolant chimney and the air chimney. The coolant in the coolant chimney passes heat to the internal fins of that chimney by convection. Those fins are connected by thermally conductive materials through the wall of that chimney, through the wall of the other chimney, to the fins inside the air chimney, where those fins pass heat by convection to the upward flowing ambient air. This flow can be augmented by a fan or fans, but passive flow will be sufficient in some embodiments. In addition to using convection to expel heat to the environment, the air chimney will also radiate heat from its outer walls. In some embodiments the air chimney will only have one outer lateral surface, but can have up to three external lateral surfaces.

Most heat in the invention will be expelled to the environment through convection to the air flow, however, in some embodiments, especially those using thermoelectric coolers, a significant amount of heat will be expelled by radiation from the outer walls of the air chimney. The rate of convection at the surface between two substances is directly related to their difference in temperature. The rate of heat radiation between these same two substances is related to the difference in the fourth exponents of their two temperature. At lower deltas, radiation is insignificant. As the delta increases, the radiation increases faster than the convection, until it is the more significant factor.

Thermal conductivity is the most important factor to consider when constructing the internal fins of both chimneys and the lateral wall in-between them. Thermal emissivity, however, is the most important factor to consider when constructing the external walls of the ambient-air chimney. These are the most important surfaces for radiating heat.

Hardware problems are a reality with all computer systems. For both repairs and upgrades, it is important to be able to service the internal components. The design of the invention makes it easy to service its internal components. The optical and hard drives will both be above the liquid cooled chambers in most embodiments. These will be accessible when the main cover is removed. The cover of each motherboard chamber can also be opened. A motherboard then slides easily out. It is a simple matter at this point to unplug a motherboard and replace it or apply upgraded hardware components.

The invention is a specific type of computer called a cluster. Most clusters require hours of setup by a trained computer engineer. The goal of this invention is to build a cluster that works out of the box without any setup. The software configuration of the invention enables the entire cluster to operate as one computer, and only requires that the user interact with the main motherboard.

Incorporating as many off-the-shelf components as possible is essential for keeping costs manageable. One of the benefits of the present invention is the fact that it is inexpensive. The majority of presently available supercomputers incorporate many custom-made components that add a great deal of expense. This invention utilizes standard off-the-shelf components for its processors and memory devices. By doing so, the manufacturer of this invention will benefit greatly from our economies of scale. Off-the-shelf parts are a significant savings over custom parts.

Some embodiments of the inventions will use standard off-the-shelf parts for some or all of these components: RAM, motherboards, hard drives, optical drives, switches, pumps, heatsinks, solid-state memory devices. Certain components however, such as the motherboard chambers, are not available off-the-shelf and must be custom-made.

Among presently available software technologies, the two most common ways to utilize the multiple processors of a cluster are: 1.) The use of a stack to distribute non-interdependent processes across the cluster, and 2.) Message-passing between interdependent processes running in parallel across the cluster. A well-known version of (1.) is an open-source software package called OpenMosix. For the present invention, OpenMosix may be configured so that it is able to monitor the status of all available processors. When a series of non-interdependent commands are put on the OpenMosix stack, they are each automatically distributed to the least busy processor in the cluster. This software package enables the efficient utilization of all the processors in the cluster while only placing commands on one stack. This level of abstraction and simplification makes parallel computing relatively easy. Another well-known version of (1.) is the Sun Grid Engine (SGE), which has as an improvement over OpenMosix, the ability to enable different levels of usage for different users.

A well-known version of (2.) is another open-source library called 'Message Passing Interface' (MPI). MPI is a collection of libraries that allows code running on any processor to communicate with code running on any other processor in the cluster. This method is more complex that (1.), but more flexible.

OpenMosix, SGE, and MPI could potentially be configured during the construction of the invention, so that the invention can be delivered with this difficult setup stage already completed. The exact configuration will depend on the needs of the end-user. From the moment the computer is received by the user, all processors in the cluster are already configured to be used as one computer. Said configuration is stored on the hard drive.

Some embodiments of the invention have a casing made from aluminum and each liquid-tight container is made from a transparent plastic or Plexiglas.

Some embodiments of the invention have a casing made from aluminum and each liquid-tight container is made from a transparent plastic or Plexiglas, where the external aluminum casing has gaps to allow visibility to the internal components.

Some embodiments of the invention have each motherboard connected to the others through high-bandwidth connections including but not limited to TCP/IP connections and bus interlink connections.

Some embodiments of the invention can either coordinate all processors on one problem or have them operate independently on separate problems.

Some embodiments of the invention have different multiples of motherboards share each motherboard chamber. There can be one, two, three, or more motherboards in each chamber.

Some embodiments of the invention have each liquid-tight chamber contoured to enable the efficient flow of liquid coolant while minimizing the overall volume of liquid necessary to cover the surface each component. Some embodiments have more elaborate configurations which may include channels to guide the liquid coolant directly to the components that generate the most heat.

Some embodiments of the invention have all components liquid cooled. Some embodiments utilize some air cooling for some components.

Some embodiments of the invention have coolant chimneys that extend the full height of the invention, with air chimneys that have fins that extend the full height of the invention.

Some embodiments of the invention can increase or decrease the cooling power of the thermoelectric coolers according to a thermostat or series of thermostats throughout the components of the invention. Some embodiments of the invention can increase or decrease the flow of coolant to all or certain chambers according to a thermostat or series of thermostats throughout the components of the invention.

Some embodiments of the invention have one motherboard function as a head node to which the other motherboards are logically slaved. Other embodiments have each motherboard capable of being a head node for a given time. Other embodiments have each motherboard act as an equal peer. Other embodiments have all motherboards organized into hierarchies of varying complexity.

Some embodiments have one motherboard connected to the outside network, and all other boards connected to that one. Some embodiments have other motherboards connected to the outside network as well, and yet are also all connected to each other internally. Some embodiments have a firewall running on only the main node that is connected to the outside world, while other embodiments have a firewall running on other nodes as well.

Some embodiments of the invention have off-board memory devices (e.g. Hard Drive, Optical Drive, Flash Drive) connected only to the head node. Other embodiments have such components connected to other motherboards as well.

Some embodiments of the invention have the external heatsink(s) assisted by a quiet fan. Other embodiments have no fans.

Some embodiments of the invention have the case made physically secure by a lock to prevent unauthorized access of its components. In some embodiments, this lock is entirely physically inside the case with an external interface which passes codes electronically, mathematically, or by some other method.

In some embodiments of the invention, each motherboard, with the exception of the Main Motherboard, is hot swappable. In some other embodiments, any motherboard is hot-swappable.

Some embodiments of the invention have a button which can be pressed or command initiated on the head node in order to cut power to a specific motherboard after migrating all important processes from that motherboard to the other motherboards.

Some embodiments of the invention have a Power Supply Unit with one or multiple batteries through which all the power for the invention is drawn.

Some embodiments of the invention have a simple software interface which allows novices to exploit the capabilities of the invention.

Some embodiments of the invention have the power of each chip maximized by methods including but not limited to overclocking.

Some embodiments of the invention have the external vertical surfaces of the chimneys covered by a transparent layer of a material with low thermal conductivity but high transparency to infra-red radiation. Such a material (If correctly chosen), would allow heat to pass through its surface in the form of infra-red radiation while not being too hot for a person to touch it.

Some embodiments have one or more character displays which show statistics on each motherboard including but not limited to CPU usage, RAM usage, Network usage, and bus usage, and CPU temperature. These displays may also be graphic displays.

Some embodiments are based on a standard-sized rack that incorporates a power supply unit, high-speed switch, and full liquid-cooling system. There are many vertical slots for motherboard chambers. Each chamber has a multi-use connector on its back surface. In some embodiments, each motherboard is hot-swappable. In some embodiments, a button must be pressed or a command entered in order to migrate all processes from that motherboard to other motherboards, and then shut it down. In some embodiments, such a command or button press can cause that chamber to pop out once the motherboard or boards inside it has been shutdown.

DETAILED DESCRIPTION OF THE PREFERRED EMBODIMENT

The preferred embodiments described here employ the use of technology available in early 2007. Future embodiments will employ better technology as it becomes available in accordance with the descriptions in this patent. "Embodiments" is plural here only because possible alternate configurations are given at key points in the following text. The choice in each case depends on the exact software application to be run on the invention. There are many trade-offs that cannot be calculated until such a decision is made. The invention is primarily one of hardware, so such trade-offs are considered outside the scope of this description.

One of skill may construct any of these preferred embodiments. Necessary details are described, but common knowledge has been omitted.

The invention provides 4 motherboard chambers, each with two motherboards. Each motherboard (using present technology) has the maximum of four CPU's (or "chips"), and each CPU is multi-core. Using present technology the CPU's will each have two cores. Some may have four cores. A higher number of cores will be preferred for applications that are parallel-process heavy. Otherwise, less cores could be preferable. Each motherboard has on it a plurality of RAM sticks, which in present technology is about 16 sticks of RAM with 4 GB each. More RAM is almost always preferable if possible.

Possible motherboards include but are not limited to: 2 The Max, A-Open, AAEON, ABIT Ltd., APC, Apple, AST, ASUSTek, Abit, Acma, Acorp, Acqutek, Acrosser, Adastra Systems, Advance Creative, Advanced Logic Research, Advantech, Amax, Amptron, Arima, Aristo, Arvida, Asus, Atrend, Azza, BCM Advanced Research, BioStar, Biostar, BoardRunner, Caliber Computer Corp, California Graphics, Chaintech, Champion-First, Chicony, Clevo, Commate, Compaq, CompuTrend Systems, Concord, Cybernet Manufacturing, Cycle Computer, DFI, DTK, DataExpert, Dell, Deskstation Technology, Diamond, Diamond Flower, Digicom Group, Digital, Domex, ECS, EDOM Int.l Corp, EFA Corp., ENPC, EPoX, Eagle, EliteGroup, Elpina, Epson, Eupa Computer, Eurone, Expert Computer Int., FIC, Famous Technology, Fastfame, Fine-Pal Company Ltd., Flexus, Flytech, Freetech, GVC, Gainward, Gateway 2000, Gemlight, GigaByte Technology, Global Circuit Technology, HOLCO, Heisei, Hewlett Packard, Hongfaith, Hope Vision, Houston Technologies, Hsin Tech, IBM, INSIDE Technology, IWILL, Iwill Corp., Impression Products, Inc., Industrial Computers, Intel, Iwill, J-Mark, J. Bond, JDR, Jamicon, Jaton Jaton, Jetway, Kam-Tronic, Kapok, Koutech, Kouwell, LAN Plus, Lanner Electronics, Leadtek, Legend, Leo Systems, Lucky Star, M Technology, MPL, MSI, Magic Pro, Matsonic, Maxtium, Mega System, MegaStar, Megatel, Megatrends, Micro Star, Micron Electronics, Micronics, Microway, Midwest Micro-Tek, Mitac, Mitsuba, Modcomp, Motorola, Mycomp, Mylex, Mynix, NEC, NMC, NewStar Engineering, NewStar Tech, Niagra Technology, Nucleus Electronics, Ocean Int'l, Ocean Office Automation, Omnibyte, Opti, PC Chips, PC Max, PC Quest, PC Ware, PC Wave, PC-Partner, Packard Bell, Pep Modular Computers, Phytec, Pine Group, Pine Support, Pine USA, Portwell, Powercolor, Predator, Premio PC, Pride, ProTech, Procomp, Promise Technology, Pronix, QDI, RIAS Corp, RadiSys, Recortec, Rioworks, Rise, Rise Computer Inc., S-MOS Systems, SBS, Samtec, Seanix, See Thru Data Systems, Servex, Shuttle, Soltek, Sonic, Sono, Sowah Group, Soyo Computer, Super Tek, SuperMicro, TMC, Tandex, Tatung, Tekram, Tempustech Inc, Texas Micro, Transcend, TriGem, Tripod Technology, Tyan, US Logic, USI, VIP, VOBIS, VTI, Vextrec, Vtech, Warpspeed, Wedge Technology, Winco Electronic Co. Ltd., YKM, Yakumo, and Zida.

Possible CPU's include but are not limited to: AMD, Centaur, Cyrix, Elbrus, Evergreen, IDT, Intel, Marek, Motorola, National Semiconductor, Rise Technology, Silicon Integrated Systems, Sun Microsystems, ST Microelectronics, Sandpile.org, Texas Instruments, Transmeta, VIA, ZF Micro Devices, Possible choices for RAM include but are not limited to: AGFA, ALR, AMS Tech, Apple, ARM, ASRock, AST, AT&T, Abit, Acer, Adaptec, Albatron, Ali, AlienWare, Altima, Ambra, Amptron, Aopen, Apple, Aspen, Asus, Averatec, BCM Advanced Research, Bay Networks, Biostar, Broadax Systems, Brother, CTX, Calcomp, Canon, Casio, Chaintech, Chaparral, ChemUSA, Chicony, Cisco, Clear Cube, Clevo, Cobalt Networks, Commax, Compal, Compaq, Compuadd, Cubix, Cybernet, Cyrix, DFI, DPS Electronics, DTK, Daewoo, Data General, Dell, Digital, ECS, Elite, Epox, Epson, Ergo, Everex, FIC, FOSA, Foxconn, Freetech, Fuji, Fujitsu, GCC, Gateway, Gemlight, Gigabyte, Hewlett Packard, Hitachi, Howard Computers, HyperData, IBM, ICS, Intel, Intergraph, Itronix, Iwill, JVC, Juniper, KDS, Kapok, KeyData, Kiwi, Kodak, Konica, Kyocera, Legend QDI, Lenovo, Lexmark, MAG, Macro System, Matsonic, Micron, Micronics (S3/Diamond), Microstar, Minolta, Miscellaneous, Mitsubishi, Mobile Data, Motion Computing, Motorola, NCD, NCR, NCS Technologies, NEC, Newisys, Nikon, Nokia, Nortel Networks, OCZ, Okidata, Olivetti, Olympus, Oracle, PC Chips, Packard Bell, Palm, Panasonic, Pentax, Polaroid, Polywell, Power Computing, Premio, ProStar, QDI, QMS, Quantum, Ricoh, RioWorks, Sager Midern, Samsung, Sanyo, Sceptre, Sharp, Shuttle, SiPix, Siemens Nixdorf, Silicon Graphics, Smart Modular, Sony, Soyo, Sun, SuperMicro, Symbol, Tally, Tandy, Tangent, Tatung, Tekram, Tektronix, Texas Instruments, Tiny Computers, Toshiba, Tribeside, Twinhead, Tyan, UPS, Umax, Unisys, VIA, Vadem, Viewsonic, Visionman, Vivitar, Wedge, Winbook, Wyse, Xerox, Zenith, Zeos, eMachines, f5, systemax, and vpr Matrix.

To overclock the chips, the BIOS of each motherboard must be reprogrammed during construction. This can be done by starting up each BIOS and altering its settings by hand. This can more efficiently be done by reprogramming using an automated process running on another computer. It is important to alter not only the clock speed of the onboard processors, but the voltages sent to those processors as well. Some utilities will make these alterations automatically for you, others will not. Sending the wrong voltages can be disastrous. Intel chips, among others, have self-limiting thermometers that slow down the processing if they get too hot. This is a desirable CPU quality for the preferred embodiment.

When constructing an embodiment of the invention using specific parts for the first time, overclocking settings should be increased in small increments from the factory defaults. While doing so, closely monitor the temperature of each CPU. If the temperature gets near a temperature that could be damaging for the components, increasing the capacity of the cooling systems by either increasing the rate of the liquid coolant flow, adding a fan to the air chimneys, increasing the size of either the air chimneys or coolant chimneys or both, or increasing the power to thermoelectric coolers.

In order to pack two motherboards as closely together as possible, in a coplanar configuration, with the component sides facing each other, special heatsinks must be found for each CPU. It is preferred, if possible, to get heatsinks that are as wide as possible in each direction than is parallel with the motherboard, and extending off of the motherboard only as high as the highest other motherboard component. The thickness and numerosity of the fins on each of these special heatsinks should be optimized for the chosen liquid coolant. More viscous solutions work better flowing by heatsinks that has more widely spaced fins.

Depending on the optimal operating temperature of the selected CPU's, a specific liquid coolant is chosen. If desired, that liquid is chosen so that it boils upon contact with these special heatsinks, thus carrying away more heat than is carried away by liquid that merely passes by. The state change from liquid to gas requires energy. The molecules of coolant get this energy by taking heat away from the surface of the heatsink. The gas form of the coolant will rise, pass into a coolant chimney, and condense there. In order to force it into the top of a coolant chimney, the system must be airtight and liquidtight. The perfect liquid will boil upon contact with the heat-generating components at top operation, but will not filmic-boil. One way to find the right liquid would be to make a mixture of perfluorocarbons from the same family as FC-77. These liquids all have different molecular weights and boiling points. The perfect mixture of them could provide the desired qualities.

The heat is managed internally by liquid, and expelled to air which carries it to the environment. The liquid should flow upward through the motherboard chambers, and any other chambers with heat-generating components, like the power supply, for instance. The natural rising of hotter liquid, and gas in the case of boiling, will enhance the upward direction of flow. The intake for liquid coolant should be near the bottom of each chamber. The heated coolant should exit the chamber at the top. This direction is reversed at the coolant chimneys. The coolant cools and becomes more dense as it descends, thus enhancing the downward direction of the coolant through the coolant chimney. Air should flow upward through the air chimneys. Cool ambient air which enters the bottom will be heated as it flows upward through the air chimney. Since hot air tends to rise, the upward direction of the air flow will be enhanced.

The invention does not rely entirely on convection to expel its heat into the environment. Infra-red radiation is also employed. In the preferred embodiment, each of the air-chimneys has two later faces that vertically extend almost the entire height of the invention. These faces should be made out of a material that has a high thermal emissivity. One preferred material is black-anodized aluminum. Heat from the internal fins will be easily conducted to it, and it will efficiently radiate some of that heat. Radiation will be more important for the air chimney coupled with the hot side of the thermoelectric coolers. The hot side of these coolers could potentially get significantly hotter than the hottest heat-generating components inside the invention. All of this "extra" heat, however, will be outside the reach of the liquid coolant that runs throughout. Only the ambient air will be exposed to this extra heat. The greater temperature differential on this air chimney will mean than much more heat can be radiated.

There should be a main cover which covers all components such as the optical drive, hard drive, and the motherboard chambers. If desired, the optical and hard drives can be affixed to the underside of the main cover so that when it is opened, all of the motherboard chambers are exposed. Each chamber with heat-generating components (and therefore liquid coolant), must be liquidtight and airtight, however, they must also be easy to open from above. This is preferably done while the unit is turned off, but it may be done while the unit is functioning as well. If a motherboard is to be removed while the unit is functioning, take care to remove leads in such a way as to avoid electrocution. Once the chamber is open, a motherboard or other component can be easily slid upward, allowing the liquid coolant to drip off of the components and back into the chamber, thus staying within the unit. All connectors to that motherboard can now be disconnected and reconnected to a new motherboard. In order to make the chamber liquidtight and airtight, a soft rubber gasket can be used, along with a clasping or clamping mechanism. The type of closure is not important, only the quality of it.

In the preferred embodiment, the logical configuration could be described as a master node with a number of headless slave nodes. They are headless because they do not have hard drives. The only hard drive is connected to the master node. They are slave nodes because they take orders from the master node. The user interacts only with the master node and does not need to think about the other nodes. The user submits a task and it is automatically migrated to the other processors as necessary. OpenMosix, and MPI should both be available to the end user. This software configuration can be done by the manufacturer via an automated process so that the box is ready to be used upon arrival.

In the preferred embodiment, off-the-shelf components should be used for the CPU's, the motherboards, the RAM, the optical drive, the switch, the hard drive, the fans, the thermoelectric coolers, the pump, and all cables and connectors. Custom parts are preferred for the power supply, the air chimneys, coolant chimneys, and the chambers and overall enclosure. The custom parts should be designed to enable the overall enclosure to be as small as possible.

The overall enclosure and the casing of each chamber could each be constructed of plastic, or aluminum, or a combination thereof. Use plastic when it is preferable to view internal components during operation. Use aluminum when heat transference is the only concern. The little bit of extra heat expulsion that may take place apart from the beforementioned liquid coolant cycle cannot hurt. If the external faces of the air chimneys are too hot to touch, a layer of IR-transparent plastic can be put on the outside of these faces. This will make them safe to touch while not inhibiting radiation. A mesh of some kind would also effect this function.

Each motherboard can be connected to the others through high-bandwidth connections including but not limited to TCP/IP connections and bus interlink connections. If using a special interlink that is not on-board, and the card enabling this connection sits perpendicular to the plane of the motherboard, a special connector for that card should be made so that it connects at an angle therefore reducing its footprint perpendicular to the motherboard.

In the preferred embodiment, only the main node is connected to the outside world, and only it has a hard drive and optical drive connected to it, and only it has a firewall running on it.

A thermostat system should be enabled so that temperatures can be monitored and action can be taken if necessary to increasing cooling capacity. The onboard temperature sensors can be used, if desired. A separate thermostat system can also be put in place. The only important thing in this respect is that temperature is monitored. The CPU manufacturer's guidelines should determine your optimum operating temperature range. When the upper bound of this range is reached, action should be taken which can include but is not limited to: increasing power to the thermoelectric coolers, increasing power to the fans, increasing the rate that the pump is functioning.

Once the motherboards and all components are chosen, inserts can be designed to take up the extra space inside each motherboard chamber. It should be designed to promote the cooling of all heat-generating components while reducing the overall amount of liquid required to fill the chamber.

In one preferred embodiment, the height of each of the coolant chimneys is only half of the height of the invention. In this configuration, the liquid flows from the bottom of this chimney into the top of the second coolant chimney. Gravity easily brings it down. In this embodiment, the fins in the air chimneys only extend as high as the coolant chimney with which it has been coupled. In another preferred embodiment, both chimneys extend the full height of the invention. Liquid still flows from the bottom of the first coolant chimney to the top of the second, but it may not flow as easily if there are bubbles in the system. The system should be tuned so that the liquid is forced through this exchange by the fact that liquid is being pumped from the bottom of the second coolant chimney.

In a preferred embodiment there is a quiet fan at the bottom of each air chimney. It should be at the bottom instead of the top because cooler air is denser. More air molecules will effect more cooling.

In a preferred embodiment, the overall enclosure is locked in such a way that internal components cannot be physically accessed without opening the lock. This will prevent an easy method of firewall circumvention.

In a preferred embodiment, the power supply is a line conditioner and an uninterruptible power supply. The AC current will be converted to DC only once, and stored in batteries as it is simultaneously drawn by the various electronic components.

In a preferred embodiment, the computer is supplied with a simple interface that allows a user to exploit the great capabilities of the invention while only being a novice computer user.

In a preferred embodiment, the user can check a number of statistics either from the computer interface, or in a separate display on the invention itself. These statistics can include but are not limited to CPU usage, RAM usage, Network usage, and bus usage, and CPU temperature.

In another, very different preferred embodiment, the form factor of the invention is based on a standard-sized server rack, which is approximately six feet high using present technology. The rack would hold a power supply unit for a plurality of motherboards, a high-speed switch with a connection for each node, and full liquid-cooling system that can bring cooled liquid to each node, and bring hot coolant to the heatsink chimneys in back. There would be many vertical slots for motherboard chambers. Each chamber has a multi-use connector on its back vertical surface. Each motherboard is hot-swappable. In some embodiments, a button must be pressed or a command entered in order to migrate all processes from a given motherboard to other motherboards, and then shut it down. In some embodiments, such a command or button press can cause that chamber to also pop out, releasing the multi-use connector, once the motherboards in that chamber have been shutdown.

What is claimed is:

1. A computer enclosure comprising: at least one vertical chamber enclosing heat-generating components; non-conductive liquid coolant flows generally upwards in said chamber being in direct contact with the heat-generating components; a first cooling chamber receiving the liquid coolant and the liquid coolant flows to a second cooling chamber that is disposed under the first cooling chamber; an air chimney having a plurality of vertical fins inside is thermally connected to the first cooling chamber and to the second cooling chamber; a pump installed at a lower portion of the second cooling chamber is pumping the liquid coolant to the at least one vertical chamber.

2. The computer enclosure of claim 1, wherein at least one thermoelectric cooler is in thermal contact with said second cooling chamber.

3. The computer enclosure of claim 1 wherein properties of the liquid coolant are such that it boils on contact with the heat-generating components and condenses in the first and the second cooling chambers.

* * * * *